US012638585B1

(12) United States Patent
Barber et al.

(10) Patent No.: US 12,638,585 B1
(45) Date of Patent: May 26, 2026

(54) LIGHT DETECTION AND RANGING (LIDAR) SENSOR SYSTEM USING DIGITAL DOWN CONVERSION

(71) Applicant: Aurora Operations, Inc., Mountain View, CA (US)

(72) Inventors: Zeb Barber, Bozeman, MT (US); Craig Benko, Bozeman, MT (US)

(73) Assignee: AURORA OPERATIONS, INC., Pittsburgh, PA (US)

( * ) Notice: Subject to any disclaimer, the term of this patent is extended or adjusted under 35 U.S.C. 154(b) by 955 days.

(21) Appl. No.: 17/888,345

(22) Filed: Aug. 15, 2022

(51) Int. Cl.
| | |
|---|---|
| *G01C 3/08* | (2006.01) |
| *G01S 7/481* | (2006.01) |
| *G01S 7/4913* | (2020.01) |
| *G01S 17/34* | (2020.01) |
| *G01S 17/93* | (2020.01) |
| *G02F 1/21* | (2006.01) |
| *G02F 1/225* | (2006.01) |
| *H03L 7/093* | (2006.01) |

(52) U.S. Cl.
CPC ............ *G01S 17/34* (2020.01); *G01S 7/4814* (2013.01); *G01S 7/4913* (2013.01); *G01S 17/93* (2013.01); *G02F 1/212* (2021.01); *G02F 1/225* (2013.01); *H03L 7/093* (2013.01)

(58) Field of Classification Search
CPC ........ G01S 17/34; G01S 17/93; G01S 7/4814; G01S 7/4913; G02F 1/212; G02F 1/225; H03L 7/093
See application file for complete search history.

(56) References Cited

U.S. PATENT DOCUMENTS

| | | | | |
|---|---|---|---|---|
| 2002/0071109 A1* | 6/2002 | Allen | ..................... | G01S 17/34 |
| | | | | 356/5.01 |
| 2008/0018881 A1* | 1/2008 | Hui | ....................... | G01S 7/4917 |
| | | | | 356/5.09 |
| 2015/0185244 A1* | 7/2015 | Inoue | .................... | G01S 7/4917 |
| | | | | 356/28 |
| 2017/0343652 A1* | 11/2017 | de Mersseman | ..... | G01S 7/4912 |
| 2017/0350964 A1* | 12/2017 | Kaneda | ................. | G01S 7/4865 |
| 2019/0049312 A1* | 2/2019 | Strandjord | ............ | G01B 11/14 |
| 2022/0236417 A1* | 7/2022 | LaChapelle | .......... | G01S 7/4815 |

* cited by examiner

*Primary Examiner* — Mark Hellner
(74) *Attorney, Agent, or Firm* — Dority & Manning, P.A.

(57) ABSTRACT

A light detection and ranging (lidar) sensor system may include a laser source configured to generate a beam, an electronic module, and one or more processors. The electronic module may generate, based on the beam, an optical signal that is frequency-shifted by a frequency offset relative to a local oscillator (LO) signal. The electronic module may control a transmitter to transmit the optical signal to an environment. In response to transmitting the optical signal, the electronic module may receive a returned optical signal that is reflected from an object in the environment. The electronic module may generate a digital signal based on the received signal. The electronic module may digitally mix the digital signal based on the frequency offset to generate a sample signal. The one or more processors may determine, based on the sample signal, a range to the object.

20 Claims, 17 Drawing Sheets

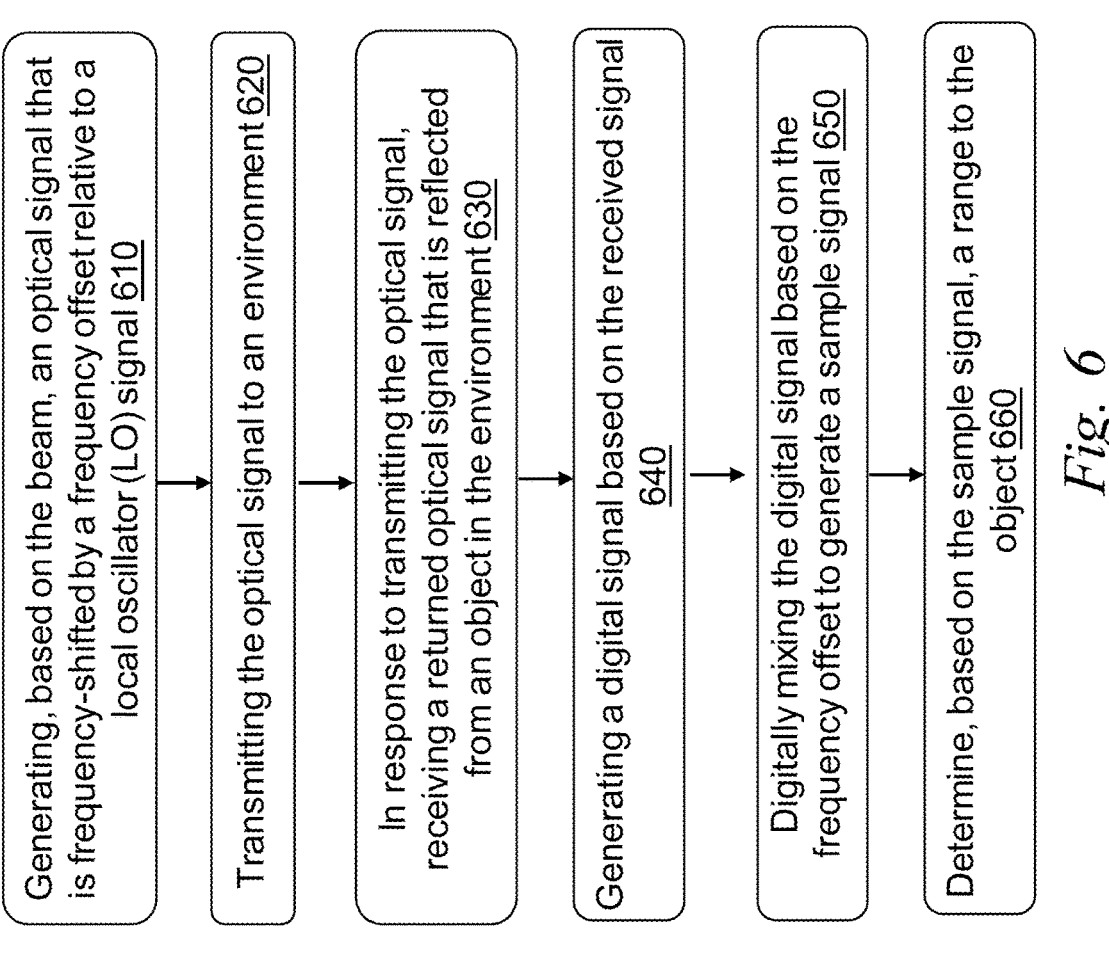

Generating, based on the beam, an optical signal that is frequency-shifted by a frequency offset relative to a local oscillator (LO) signal 610

Transmitting the optical signal to an environment 620

In response to transmitting the optical signal, receiving a returned optical signal that is reflected from an object in the environment 630

Generating a digital signal based on the received signal 640

Digitally mixing the digital signal based on the frequency offset to generate a sample signal 650

Determine, based on the sample signal, a range to the object 660

LIGHT DETECTION AND RANGING (LIDAR) SENSOR SYSTEM USING DIGITAL DOWN CONVERSION

BACKGROUND

Optical detection of range using lasers, often referenced by a mnemonic, lidar, for light detection and ranging, is used for a variety of applications, from altimetry, to imaging, to collision avoidance. Lidar provides finer scale range resolution with smaller beam sizes than conventional microwave ranging systems, such as radio-wave detection and ranging (radar). Optical detection of range can be accomplished with several different techniques, including direct ranging based on round trip travel time of an optical pulse to an object, and chirped detection based on a frequency difference between a transmitted chirped optical signal and a returned signal scattered from an object, and phase-encoded detection based on a sequence of single frequency phase changes that are distinguishable from natural signals.

In radar or lidar, single-sideband modulation (SSB) or single-sideband suppressed-carrier modulation (SSB-SC) may be used to transmit information by radio or optical waves. SSB can avoid bandwidth increase of the original baseband signal and reduce the power wasted on a carrier, while increasing the device complexity at high cost. In-phase/quadrature (IQ) sampling (also called "complex sampling" or "quadrature sampling") is a powerful technique commonly used in radar or lidar to retrieve full amplitude and phase information of a received signal. Optical IQ sampling often relies on having multiple detection and digitization channels and complex optical systems like optical hybrids.

Digital signal processing (DSP), the use of digital processing to perform a wide variety of signal processing operations, can provide simplicity without using complex circuits. A DSP system may include circuits configured to perform demodulation, decoding, and related tasks. These circuits are generally based on application-specific ICs (ASICs), field-programmable gate arrays (FPGAs) and programmable DSP devices. One of DSP techniques is digital down conversion (DDC), which is used in radio frequency signal processing and software-defined radios. DDC is a means to achieve IQ sampling while only using a single detection channel. DDC is a means to achieve IQ sampling without complex circuits or devices and with only a single detection and digitization channel. There is a need for a mechanism to optimize the use of DDC in a lidar sensor system for improved signal detection without ambiguity.

SUMMARY

Implementations of the present disclosure relate to a system and a method for a light detection and ranging (lidar) sensor system, and more particularly to a system and a method for a lidar sensor system using a digital down conversion.

In some implementations of the present disclosure, a light detection and ranging (lidar) sensor system may include a laser source configured to generate a beam, and one or more processors. The one or more processors may be configured to generate, based on the beam, an optical signal that is frequency-shifted by a frequency offset relative to a local oscillator (LO) signal. The one or more processors may be configured to transmit the optical signal to an environment. In response to transmitting the optical signal, the one or more processors may be configured to receive a returned optical signal that is reflected from an object in the environment. The one or more processors may be configured to generate a digital signal based on the received signal. The one or more processors may be configured to digitally mix the digital signal based on the frequency offset to generate a sample signal. The one or more processors may be configured to determine, based on the sample signal, a range to the object.

In some implementations of the present disclosure, autonomous vehicle control system may include one or more processors and one or more computer-readable storage mediums. The mediums may store instructions which, when executed by the one or more processors, cause the one or more processors to generate, based on a beam generated from a laser source, an optical signal that is frequency-shifted by a frequency offset relative to a local oscillator (LO) signal. The one or more processors may be configured to transmit the optical signal to an environment. In response to transmitting the optical signal, the one or more processors may be configured to receive a returned optical signal that is reflected from an object in the environment. The one or more processors may be configured to generate a digital signal based on the received signal. The one or more processors may be configured to digitally mix the digital signal based on the frequency offset to generate a sample signal. The one or more processors may be configured to determine, based on the sample signal, a range to the object. The one or more processors may be configured to control operation of a vehicle using the range to the object.

In some implementations of the present disclosure, a autonomous vehicle may include at least one of a steering system or a braking system, and a vehicle controller including one or more processors. The one or more processors may be configured to generate, based on a beam generated from a laser source, an optical signal that is frequency-shifted by a frequency offset relative to a local oscillator (LO) signal. The one or more processors may be configured to transmit the optical signal to an environment. In response to transmitting the optical signal, the one or more processors may be configured to receive a returned optical signal that is reflected from an object in the environment. The one or more processors may be configured to generate a digital signal based on the received signal. The one or more processors may be configured to digitally mix the digital signal based on the frequency offset to generate a sample signal. The one or more processors may be configured to determine, based on the sample signal, a range to the object. The one or more processors may be configured to control the at least one of the steering system or the braking system using the range to the object.

BRIEF DESCRIPTION OF THE DRAWINGS

These and other aspects and features of the present implementations will become apparent to those ordinarily skilled in the art upon review of the following description of specific implementations in conjunction with the accompanying figures, wherein:

FIG. 6 is a flowchart illustrating an example methodology for a lidar sensor system using a digital down conversion according to some implementations.

DETAILED DESCRIPTION

According to certain aspects, implementations of the present disclosure relate to a system and a method for a light detection and ranging (lidar) sensor system, and more particularly to a system and a method for a lidar sensor system using a digital conversion.

According to certain aspects, a light detection and ranging (lidar) sensor system may include a laser source configured to generate a beam, and one or more processors. The one or more processors may be configured to generate, based on the beam, an optical signal that is frequency-shifted by a frequency offset relative to a local oscillator (LO) signal. The one or more processors may be configured to transmit the optical signal to an environment. In response to transmitting the optical signal, the one or more processors may be configured to receive a returned optical signal that is reflected from an object in the environment. The one or more processors may be configured to generate a digital signal based on the received signal. The one or more processors may be configured to digitally mix the digital signal based on the frequency offset to generate a sample signal. The one or more processors may be configured to determine, based on the sample signal, a range to the object.

1. System Environment for Autonomous Vehicles

Figure 1A:
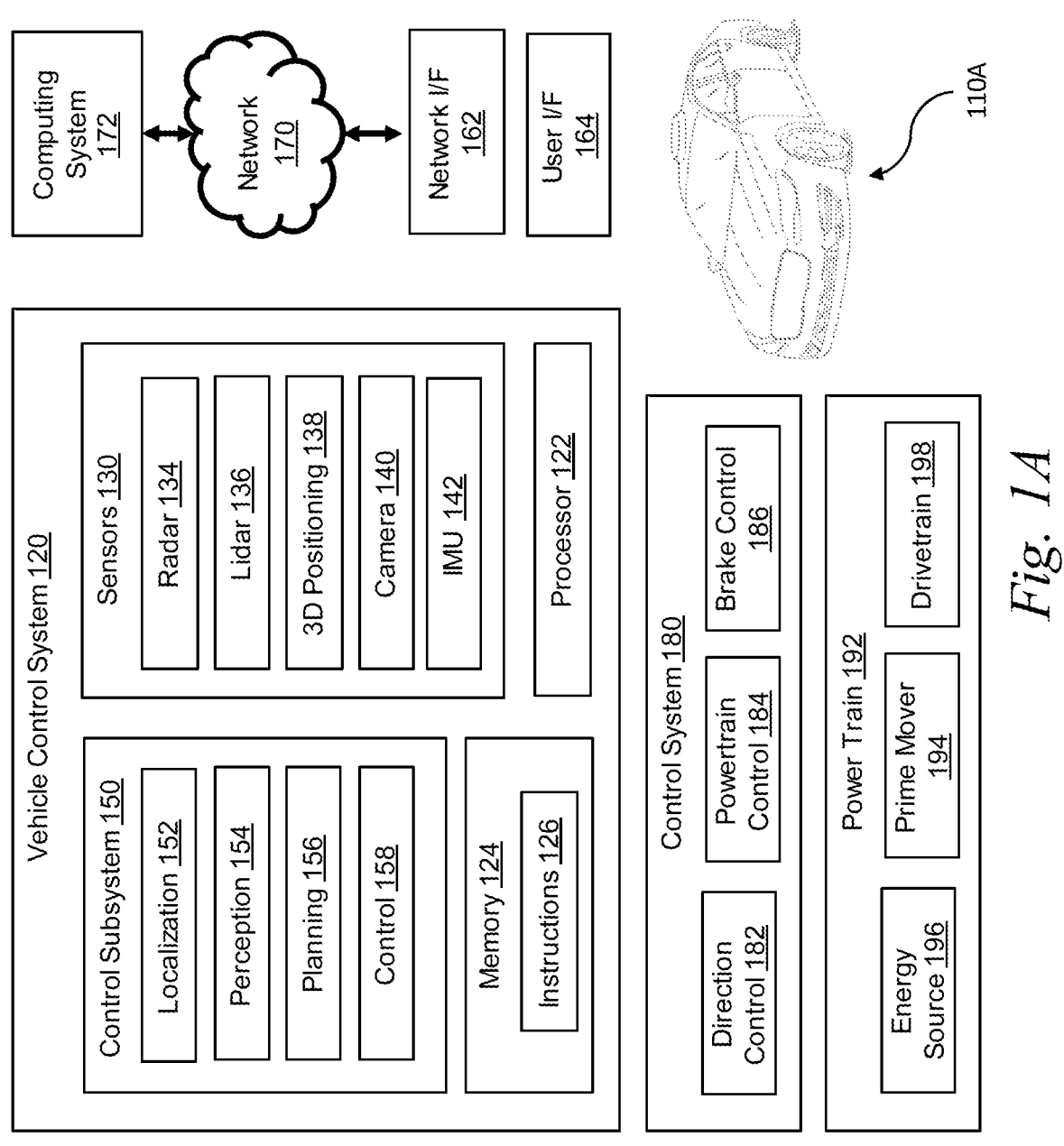
FIG. 1A is a block diagram illustrating an example of a system environment for autonomous vehicles according to some implementations.

FIG. 1A is a block diagram illustrating an example of a system environment for autonomous vehicles according to some implementations.

Referring to FIG. 1A, an example autonomous vehicle 110A within which the various techniques disclosed herein may be implemented. The vehicle 110A, for example, may include a powertrain 192 including a prime mover 194 powered by an energy source 196 and capable of providing power to a drivetrain 198, as well as a control system 180 including a direction control 182, a powertrain control 184, and a brake control 186. The vehicle 110A may be implemented as any number of different types of vehicles, including vehicles capable of transporting people and/or cargo, and capable of traveling in various environments, and it will be appreciated that the aforementioned components 180-198 can vary widely based upon the type of vehicle within which these components are utilized.

For simplicity, the implementations discussed hereinafter will focus on a wheeled land vehicle such as a car, van, truck, bus, etc. In such implementations, the prime mover 194 may include one or more electric motors and/or an internal combustion engine (among others). The energy source may include, for example, a fuel system (e.g., providing gasoline, diesel, hydrogen, etc.), a battery system, solar panels or other renewable energy source, and/or a fuel cell system. The drivetrain 198 can include wheels and/or tires along with a transmission and/or any other mechanical drive components to convert the output of the prime mover 194 into vehicular motion, as well as one or more brakes configured to controllably stop or slow the vehicle 110A and direction or steering components suitable for controlling the trajectory of the vehicle 110A (e.g., a rack and pinion steering linkage enabling one or more wheels of the vehicle 110A to pivot about a generally vertical axis to vary an angle of the rotational planes of the wheels relative to the longitudinal axis of the vehicle). In some implementations, combinations of powertrains and energy sources may be used (e.g., in the case of electric/gas hybrid vehicles), and in some instances multiple electric motors (e.g., dedicated to individual wheels or axles) may be used as a prime mover.

The direction control 182 may include one or more actuators and/or sensors for controlling and receiving feedback from the direction or steering components to enable the vehicle 110A to follow a desired trajectory. The powertrain control 184 may be configured to control the output of the powertrain 102, e.g., to control the output power of the prime mover 194, to control a gear of a transmission in the drivetrain 198, etc., thereby controlling a speed and/or direction of the vehicle 110A. The brake control 116 may be configured to control one or more brakes that slow or stop vehicle 110A, e.g., disk or drum brakes coupled to the wheels of the vehicle.

Other vehicle types, including but not limited to off-road vehicles, all-terrain or tracked vehicles, construction equipment etc., will necessarily utilize different powertrains, drivetrains, energy sources, direction controls, powertrain controls and brake controls. Moreover, in some implementations, some of the components can be combined, e.g., where directional control of a vehicle is primarily handled by varying an output of one or more prime movers. Therefore, implementations disclosed herein are not limited to the particular application of the herein-described techniques in an autonomous wheeled land vehicle.

Various levels of autonomous control over the vehicle 110A can be implemented in a vehicle control system 120, which may include one or more processors 122 and one or more memories 124, with each processor 122 configured to execute program code instructions 126 stored in a memory 124. The processors(s) can include, for example, graphics processing unit(s) ("GPU(s)")) and/or central processing unit(s) ("CPU(s)").

Sensors 130 may include various sensors suitable for collecting information from a vehicle's surrounding environment for use in controlling the operation of the vehicle. For example, sensors 130 can include radar sensor 134, lidar (Light Detection and Ranging) sensor 136, a 3D positioning sensors 138, e.g., any of an accelerometer, a gyroscope, a magnetometer, or a satellite navigation system such as GPS (Global Positioning System), GLONASS (Globalnaya Navigazionnaya Sputnikovaya Sistema, or Global Navigation Satellite System), BeiDou Navigation Satellite System (BDS), Galileo, Compass, etc. The 3D positioning sensors 138 can be used to determine the location of the vehicle on the Earth using satellite signals. The sensors 130 can include a camera 140 and/or an IMU (inertial measurement unit) 142. The camera 140 can be a monographic or stereographic camera and can record still and/or video images. The IMU 142 can include multiple gyroscopes and accelerometers capable of detecting linear and rotational motion of the vehicle in three directions. One or more encoders (not illustrated), such as wheel encoders may be used to monitor the rotation of one or more wheels of vehicle 110A. Each sensor 130 can output sensor data at various data rates, which may be different than the data rates of other sensors 130.

The outputs of sensors 130 may be provided to a set of control subsystems 150, including, a localization subsystem 152, a planning subsystem 156, a perception subsystem 154, and a control subsystem 158. The localization subsystem 152 can perform functions such as precisely determining the location and orientation (also sometimes referred to as "pose") of the vehicle 110A within its surrounding environment, and generally within some frame of reference. The location of an autonomous vehicle can be compared with the location of an additional vehicle in the same environment as part of generating labeled autonomous vehicle data. The perception subsystem 154 can perform functions such as detecting, tracking, determining, and/or identifying objects within the environment surrounding vehicle 110A. A machine learning model can be utilized in tracking objects. The planning subsystem 156 can perform functions such as planning a trajectory for vehicle 110A over some timeframe given a desired destination as well as the static and moving objects within the environment. A machine learning can be utilized in planning a vehicle trajectory. The control subsystem 158 can perform functions such as generating suitable control signals for controlling the various controls in the vehicle control system 120 in order to implement the planned trajectory of the vehicle 110A. A machine learning model can be utilized to generate one or more signals to control an autonomous vehicle to implement the planned trajectory.

It will be appreciated that the collection of components illustrated in FIG. 1A for the vehicle control system 120 is merely exemplary in nature. Individual sensors may be omitted in some implementations. Additionally or alternatively, in some implementations, multiple sensors of types illustrated in FIG. 1A may be used for redundancy and/or to cover different regions around a vehicle, and other types of sensors may be used. Likewise, different types and/or combinations of control subsystems may be used in other implementations. Further, while subsystems 152-158 are illustrated as being separate from processor 122 and memory 124, it will be appreciated that in some implementations, some or all of the functionality of a subsystem 152-158 may be implemented with program code instructions 126 resident in one or more memories 124 and executed by one or more processors 122, and that these subsystems 152-158 may in some instances be implemented using the same processor(s) and/or memory. Subsystems may be implemented at least in part using various dedicated circuit logic, various processors, various field programmable gate arrays ("FPGA"), various application-specific integrated circuits ("ASIC"), various real time controllers, and the like, as noted above, multiple subsystems may utilize circuitry, processors, sensors, and/or other components. Further, the various components in the vehicle control system 120 may be networked in various manners.

In some implementations, the vehicle 110A may also include a secondary vehicle control system (not illustrated), which may be used as a redundant or backup control system for the vehicle 110A. The secondary vehicle control system may be capable of fully operating the autonomous vehicle 110A in the event of an adverse event in the vehicle control system 120, while in other implementations, the secondary vehicle control system may only have limited functionality, e.g., to perform a controlled stop of the vehicle 110A in response to an adverse event detected in the primary vehicle control system 120. In still other implementations, the secondary vehicle control system may be omitted.

In general, an innumerable number of different architectures, including various combinations of software, hardware, circuit logic, sensors, networks, etc. may be used to implement the various components illustrated in FIG. 1A. Each processor may be implemented, for example, as a microprocessor and each memory may represent the random access memory ("RAM") devices comprising a main storage, as well as any supplemental levels of memory, e.g., cache memories, non-volatile or backup memories (e.g., programmable or flash memories), read-only memories, etc. In addition, each memory may be considered to include memory storage physically located elsewhere in the vehicle 110A, e.g., any cache memory in a processor, as well as any storage capacity used as a virtual memory, e.g., as stored on a mass storage device or another computer controller. One or more processors illustrated in FIG. 1A, or entirely separate processors, may be used to implement additional functionality in the vehicle 110A outside of the purposes of autonomous control, e.g., to control entertainment systems, to operate doors, lights, convenience features, etc.

In addition, for additional storage, the vehicle 110A may include one or more mass storage devices, e.g., a removable disk drive, a hard disk drive, a direct access storage device ("DASD"), an optical drive (e.g., a CD drive, a DVD drive, etc.), a solid state storage drive ("SSD"), network attached storage, a storage area network, and/or a tape drive, among others.

Furthermore, the vehicle 110A may include a user interface 164 to enable vehicle 110A to receive a number of inputs from and generate outputs for a user or operator, e.g., one or more displays, touchscreens, voice and/or gesture interfaces, buttons and other tactile controls, etc. Otherwise, user input may be received via another computer or electronic device, e.g., via an app on a mobile device or via a web interface.

Moreover, the vehicle 110A may include one or more network interfaces, e.g., network interface 162, suitable for communicating with one or more networks 170 (e.g., a Local Area Network ("LAN"), a wide area network ("WAN"), a wireless network, and/or the Internet, among others) to permit the communication of information with other computers and electronic device, including, for example, a central service, such as a cloud service, from which the vehicle 110A receives environmental and other data for use in autonomous control thereof. Data collected by the one or more sensors 130 can be uploaded to a computing system 172 via the network 170 for additional processing. A time stamp can be added to each instance of vehicle data prior to uploading. In some implementations, computing system 172 may have configuration similar to that of computing system 700 in FIG. 7. Additional processing of autonomous vehicle data by computing system 172 in accordance with many implementations is described with respect to FIG. 7.

Each processor illustrated in FIG. 1A, as well as various additional controllers and subsystems disclosed herein, generally operates under the control of an operating system and executes or otherwise relies upon various computer software applications, components, programs, objects, modules, data structures, etc., as will be described in greater detail below. Moreover, various applications, components, programs, objects, modules, etc. may also execute on one or more processors in another computer coupled to vehicle 110A via network 170, e.g., in a distributed, cloud-based, or client-server computing environment, whereby the processing required to implement the functions of a computer program may be allocated to multiple computers and/or services over a network.

In general, the routines executed to implement the various implementations described herein, whether implemented as part of an operating system or a specific application, component, program, object, module or sequence of instructions, or even a subset thereof, will be referred to herein as "program code". Program code can include one or more instructions that are resident at various times in various memory and storage devices, and that, when read and executed by one or more processors, perform the steps necessary to execute steps or elements embodying the various aspects of the present disclosure. Moreover, while implementations have and hereinafter will be described in the context of fully functioning computers and systems, it will be appreciated that the various implementations described herein are capable of being distributed as a program product in a variety of forms, and that implementations can be implemented regardless of the particular type of computer readable media used to actually carry out the distribution.

Examples of computer readable media include tangible, non-transitory media such as volatile and non-volatile memory devices, floppy and other removable disks, solid state drives, hard disk drives, magnetic tape, and optical disks (e.g., CD-ROMs, DVDs, etc.) among others.

In addition, various program code described hereinafter may be identified based upon the application within which it is implemented in a specific implementation. However, it should be appreciated that any particular program nomenclature that follows is used merely for convenience, and thus the present disclosure should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the present disclosure is not limited to the specific organization and allocation of program functionality described herein.

The environment illustrated in FIG. 1A is not intended to limit implementations disclosed herein. Indeed, other alternative hardware and/or software environments may be used without departing from the scope of implementations disclosed herein.

2. FM Lidar for Automotive Applications

Figure 3A:
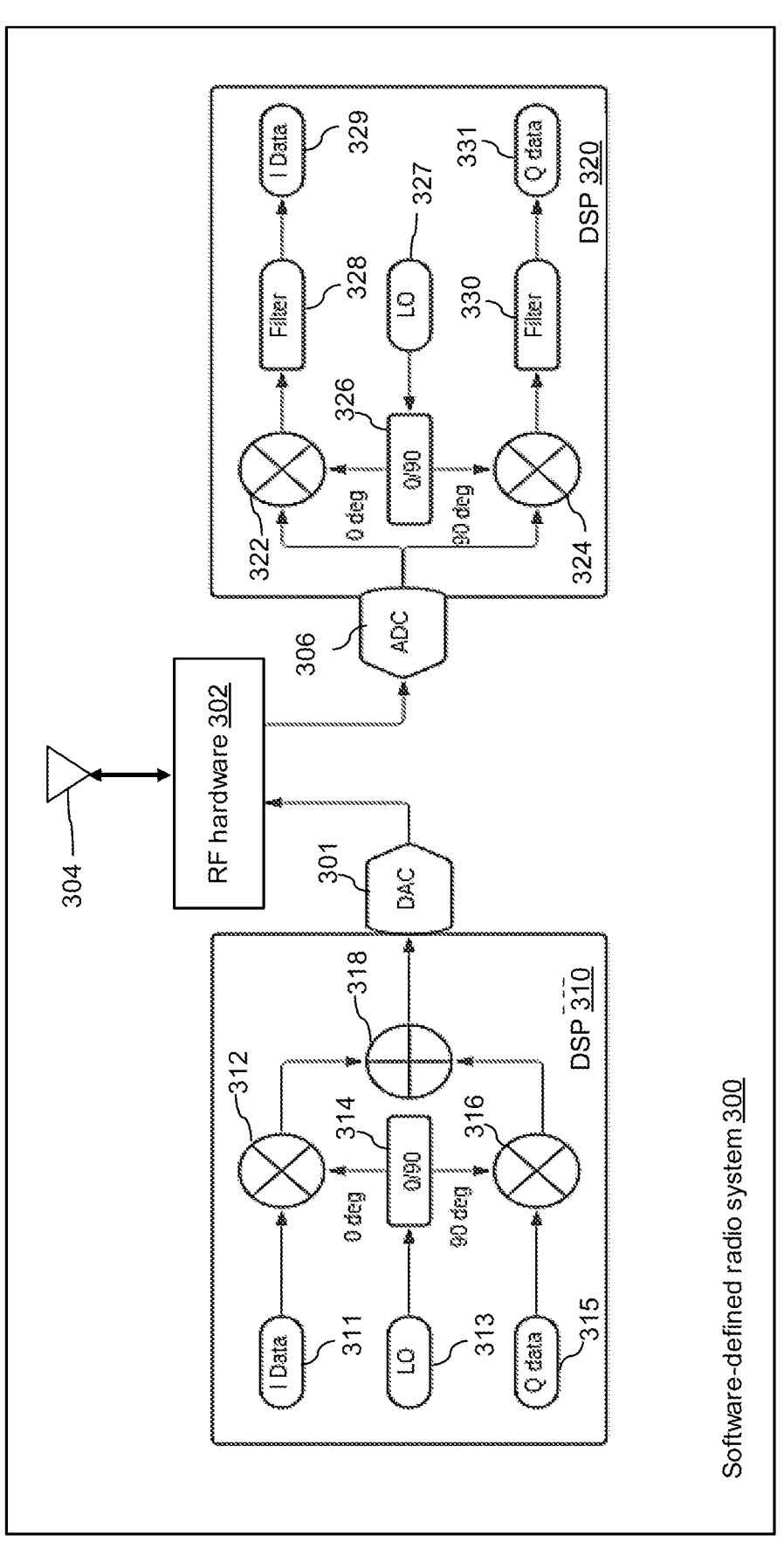
FIG. 3A is a block diagram illustrating an example of a lidar sensor system, according to some implementations.
Figure 3B:
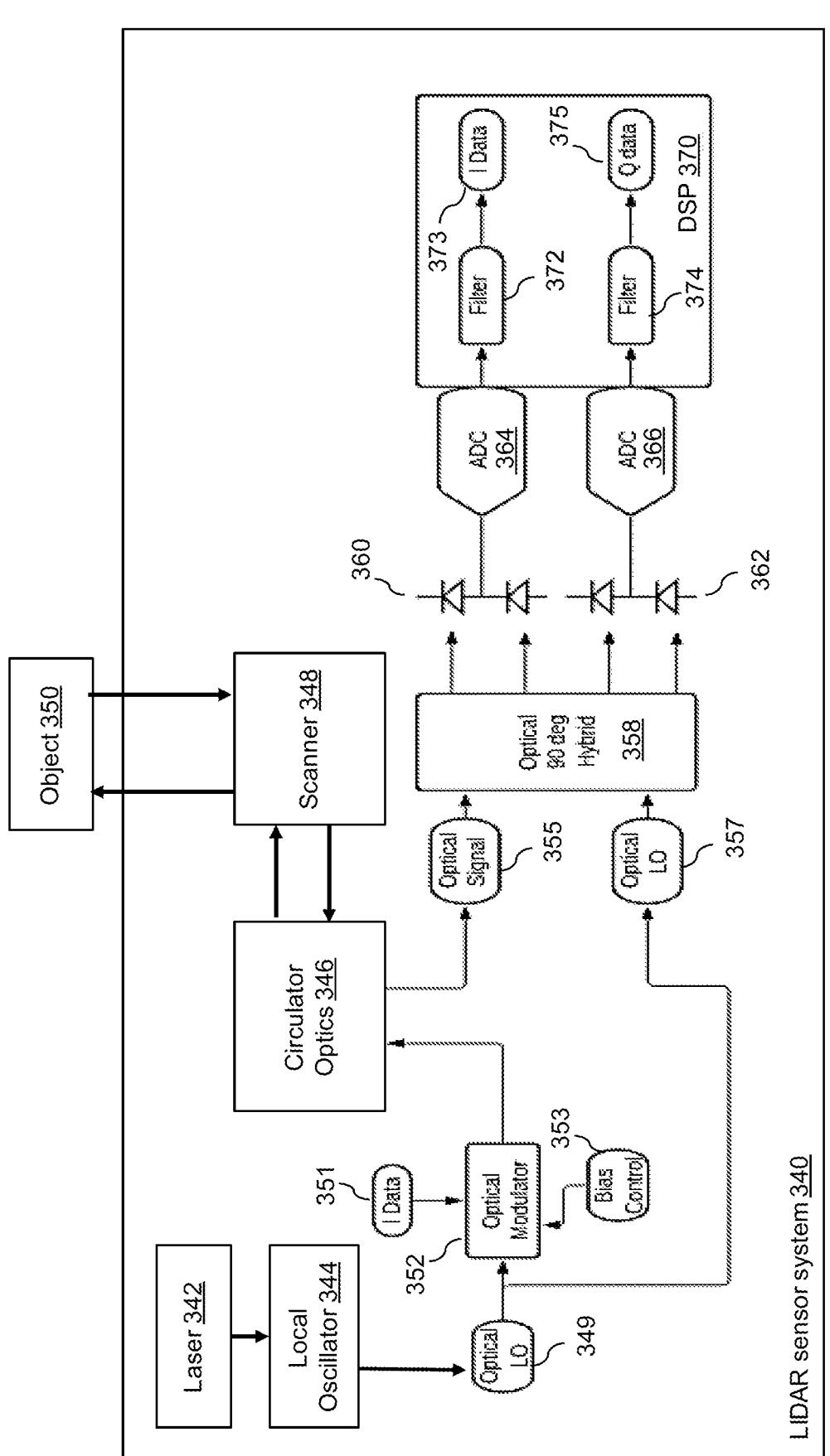
FIG. 3B is a block diagram illustrating an example of a software-defined radio system, according to some implementations.
Figure 4A:
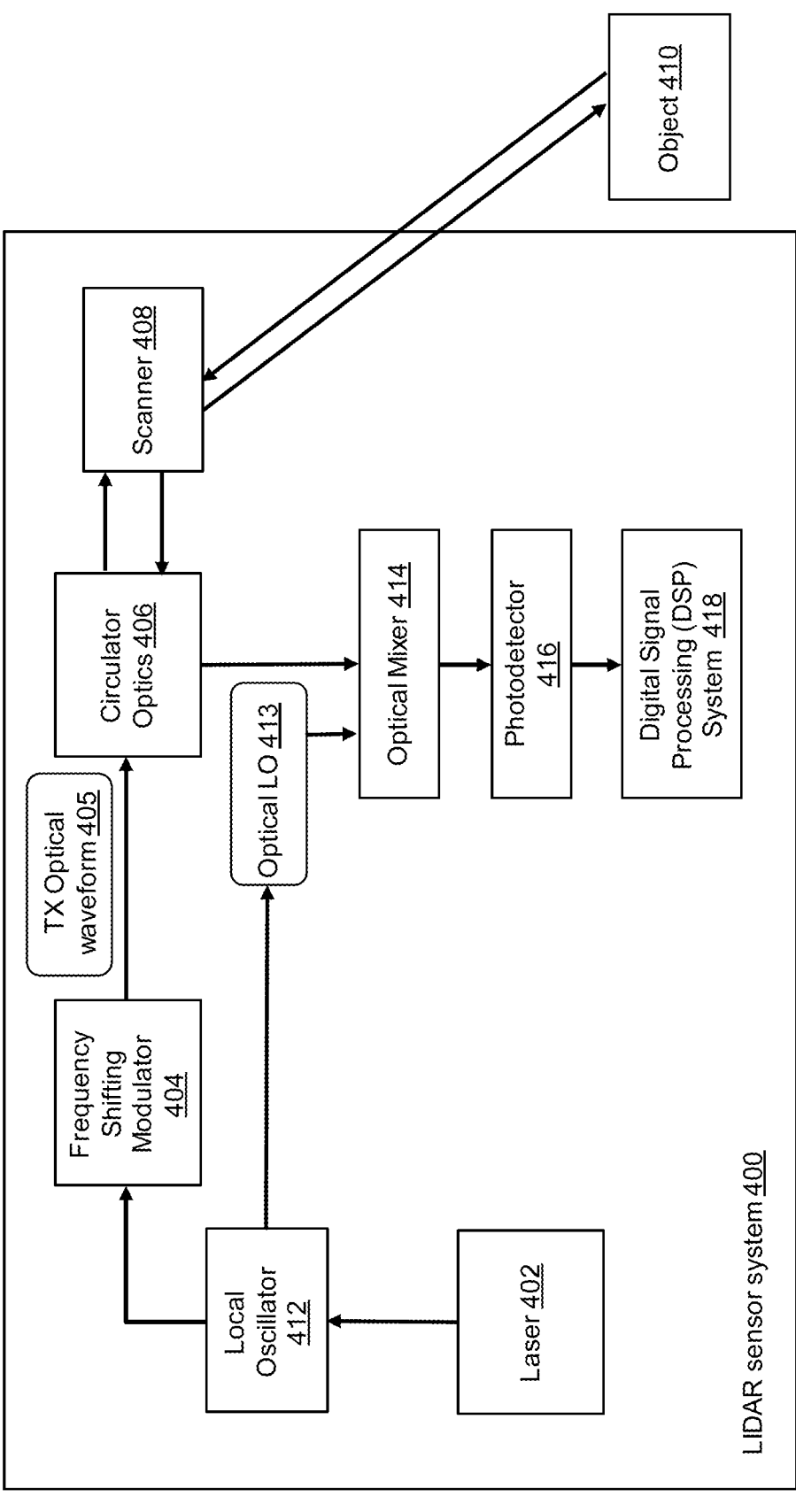
FIG. 4A is a block diagram illustrating an example of a lidar sensor system, according to some implementations.
Figure 5:
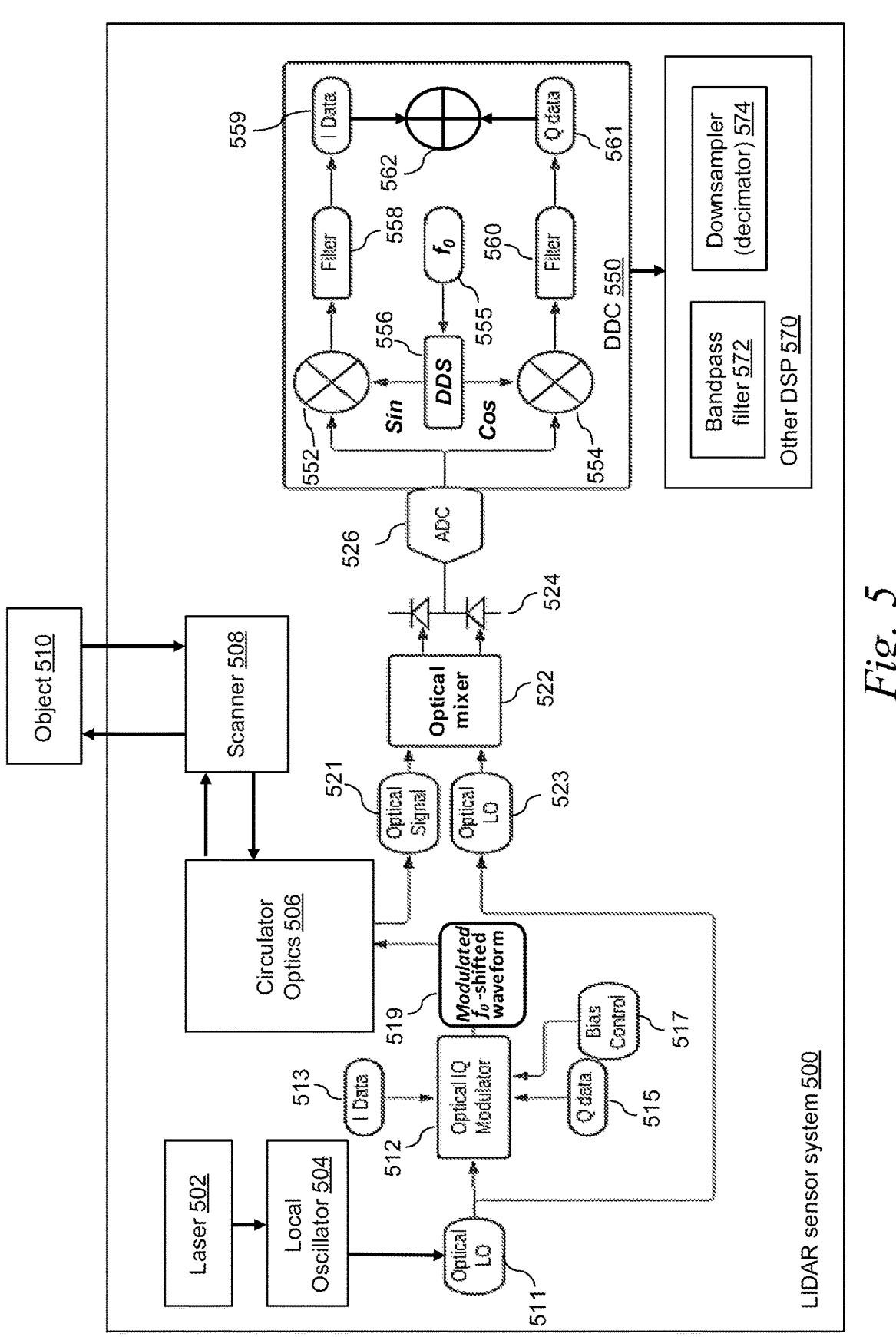
FIG. 5 is a block diagram illustrating another example of a lidar sensor system, according to some implementations.

A truck can include a lidar system (e.g., vehicle control system 120 in FIG. 1A, lidar sensor system 340 in FIG. 3B, lidar sensor system 400 in FIG. 4A, a lidar sensor system 500 in FIG. 5, etc.). In some implementations, the lidar system can use frequency modulation to encode an optical signal and scatter the encoded optical signal into free-space using optics. By detecting the frequency differences between the encoded optical signal and a returned signal reflected back from an object, the frequency modulated (FM) lidar system can determine the location of the object and/or precisely measure the velocity of the object using the Doppler effect. An FM lidar system may use a continuous wave (referred to as, "FMCW lidar" or "coherent FMCW lidar") or a quasi-continuous wave (referred to as, "FMQW lidar"). The lidar system can use phase modulation (PM) to encode an optical signal and scatters the encoded optical signal into free-space using optics.

An FM or phase-modulated (PM) lidar system may provide substantial advantages over conventional lidar systems with respect to automotive and/or commercial trucking applications. To begin, in some instances, an object (e.g., a pedestrian wearing dark clothing) may have a low reflectivity, in that it only reflects back to the sensors (e.g., sensors 130 in FIG. 1A) of the FM or PM lidar system a low amount (e.g., 10% or less) of the light that hit the object. In other instances, an object (e.g., a shiny road sign) may have a high reflectivity (e.g., above 10%), in that it reflects back to the sensors of the FM lidar system a high amount of the light that hit the object.

Regardless of the object's reflectivity, an FM lidar system may be able to detect (e.g., classify, recognize, discover, etc.) the object at greater distances (e.g., 2×) than a conventional lidar system. For example, an FM lidar system may detect a low reflectivity object beyond 300 meters, and a high reflectivity object beyond 400 meters.

To achieve such improvements in detection capability, the FM lidar system may use sensors (e.g., sensors 130 in FIG. 1A). In some implementations, these sensors can be single photon sensitive, meaning that they can detect the smallest amount of light possible. While an FM lidar system may, in some applications, use infrared wavelengths (e.g., 950 nm, 1550 nm, etc.), it is not limited to the infrared wavelength range (e.g., near infrared: 800 nm-1500 nm; middle infrared: 1500 nm-5600 nm; and far infrared: 5600 nm-1,000,000 nm). By operating the FM or PM lidar system in infrared wavelengths, the FM or PM lidar system can broadcast stronger light pulses or light beams while meeting eye safety standards. Conventional lidar systems are often not single photon sensitive and/or only operate in near infrared wavelengths, requiring them to limit their light output (and distance detection capability) for eye safety reasons.

Thus, by detecting an object at greater distances, an FM lidar system may have more time to react to unexpected obstacles. Indeed, even a few milliseconds of extra time could improve safety and comfort, especially with heavy vehicles (e.g., commercial trucking vehicles) that are driving at highway speeds.

Another advantage of an FM lidar system is that it provides accurate velocity for each data point instantaneously. In some implementations, a velocity measurement is accomplished using the Doppler effect which shifts frequency of the light received from the object based at least one of the velocity in the radial direction (e.g., the direction vector between the object detected and the sensor) or the frequency of the laser signal. For example, for velocities encountered in on-road situations where the velocity is less than 100 meters per second (m/s), this shift at a wavelength of 1550 nanometers (nm) amounts to the frequency shift that is less than 130 megahertz (MHz). This frequency shift is small such that it is difficult to detect directly in the optical domain. However, by using coherent detection in FMCW, PMCW, or FMQW lidar systems, the signal can be converted to the RF domain such that the frequency shift can be calculated using various signal processing techniques. This enables the autonomous vehicle control system to process incoming data faster.

Instantaneous velocity calculation also makes it easier for the FM lidar system to determine distant or sparse data points as objects and/or track how those objects are moving over time. For example, an FM lidar sensor (e.g., sensors 130 in FIG. 1A) may only receive a few returns (e.g., hits) on an object that is 300m away, but if those return give a velocity value of interest (e.g., moving towards the vehicle at >70 mph), then the FM lidar system and/or the autonomous vehicle control system may determine respective weights to probabilities associated with the objects.

Faster identification and/or tracking of the FM lidar system gives an autonomous vehicle control system more time to maneuver a vehicle. A better understanding of how fast objects are moving also allows the autonomous vehicle control system to plan a better reaction.

Another advantage of an FM lidar system is that it has less static compared to conventional lidar systems. That is, the conventional lidar systems that are designed to be more light-sensitive typically perform poorly in bright sunlight. These systems also tend to suffer from crosstalk (e.g., when sensors get confused by each other's light pulses or light beams) and from self-interference (e.g., when a sensor gets confused by its own previous light pulse or light beam). To overcome these disadvantages, vehicles using the conventional lidar systems often need extra hardware, complex software, and/or more computational power to manage this "noise."

In contrast, FM lidar systems do not suffer from these types of issues because each sensor is specially designed to respond only to its own light characteristics (e.g., light beams, light waves, light pulses). If the returning light does not match the timing, frequency, and/or wavelength of what was originally transmitted, then the FM sensor can filter (e.g., remove, ignore, etc.) out that data point. As such, FM lidar systems produce (e.g., generates, derives, etc.) more accurate data with less hardware or software requirements, enabling safer and smoother driving.

Lastly, an FM lidar system is easier to scale than conventional lidar systems. As more self-driving vehicles (e.g., cars, commercial trucks, etc.) show up on the road, those powered by an FM lidar system likely will not have to contend with interference issues from sensor crosstalk. Furthermore, an FM lidar system uses less optical peak power than conventional lidar sensors. As such, some or all of the optical components for an FM lidar can be produced on a single chip, which produces its own benefits, as discussed herein.

3. Commercial Trucking

Figure 1B:
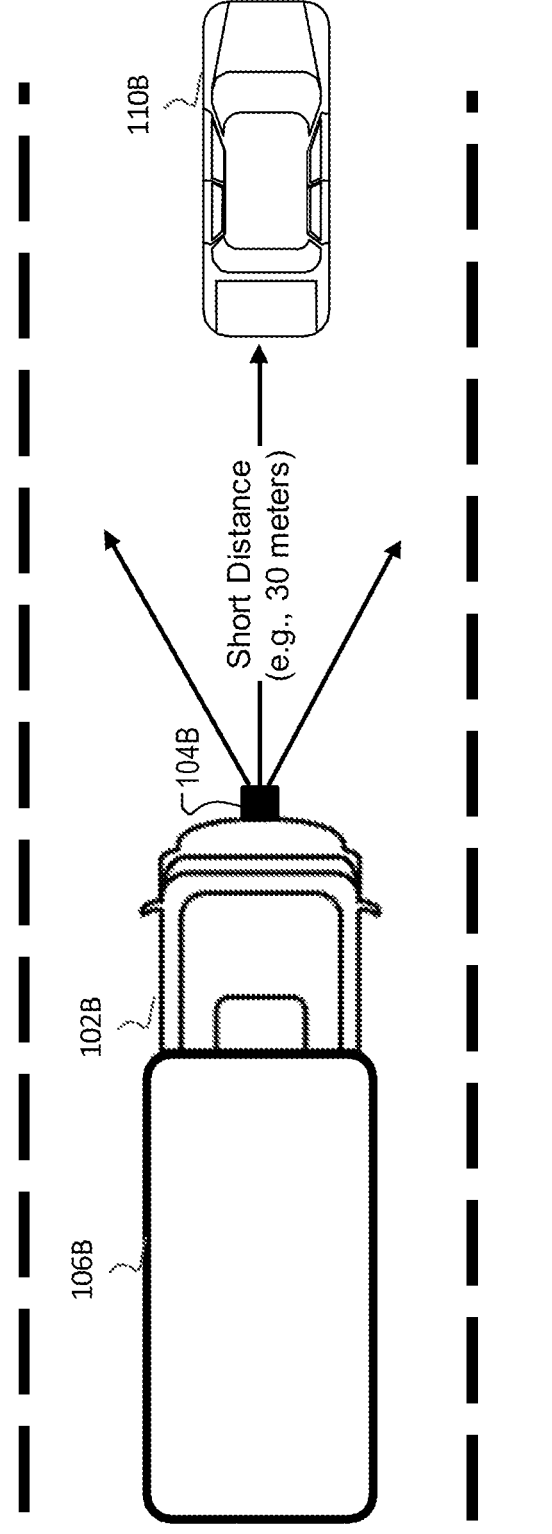
FIG. 1B is a block diagram illustrating an example of a system environment for autonomous commercial trucking vehicles, according to some implementations.

FIG. 1B is a block diagram illustrating an example of a system environment for autonomous commercial trucking vehicles, according to some implementations. The environment 100B includes a commercial truck 102B for hauling cargo 106B. In some implementations, the commercial truck 102B may include vehicles configured to long-haul freight transport, regional freight transport, intermodal freight transport (i.e., in which a road-based vehicle is used as one of multiple modes of transportation to move freight), and/or any other road-based freight transport applications. The commercial truck 102B may be a flatbed truck, a refrigerated truck (e.g., a reefer truck), a vented van (e.g., dry van), a moving truck, etc. The cargo 106B may be goods and/or produce. The commercial truck 102B may include a trailer to carry the cargo 106B, such as a flatbed trailer, a lowboy trailer, a step deck trailer, an extendable flatbed trailer, a sidekit trailer, etc.

The environment 100B includes an object 110B (shown in FIG. 1B as another vehicle) that is within a distance range that is equal to or less than 30 meters from the truck.

The commercial truck 102B may include a lidar system 104B (e.g., an FM lidar system, vehicle control system 120 in FIG. 1A, lidar system 300 in FIG. 3A, lidar system 350 in FIG. 3B, etc.) for determining a distance to the object 110B and/or measuring the velocity of the object 110B. Although FIG. 1B shows that one lidar system 104B is mounted on the front of the commercial truck 102B, the number of lidar system and the mounting area of the lidar system on the commercial truck are not limited to a particular number or a particular area. The commercial truck 102B may include any number of lidar systems 104B (or components thereof, such as sensors, modulators, coherent signal generators, etc.) that are mounted onto any area (e.g., front, back, side, top, bottom, underneath, and/or bottom) of the commercial truck 102B to facilitate the detection of an object in any free-space relative to the commercial truck 102B.

As shown, the lidar system 104B in environment 100B may be configured to detect an object (e.g., another vehicle, a bicycle, a tree, street signs, potholes, etc.) at short distances (e.g., 30 meters or less) from the commercial truck 102B.

Figure 1C:
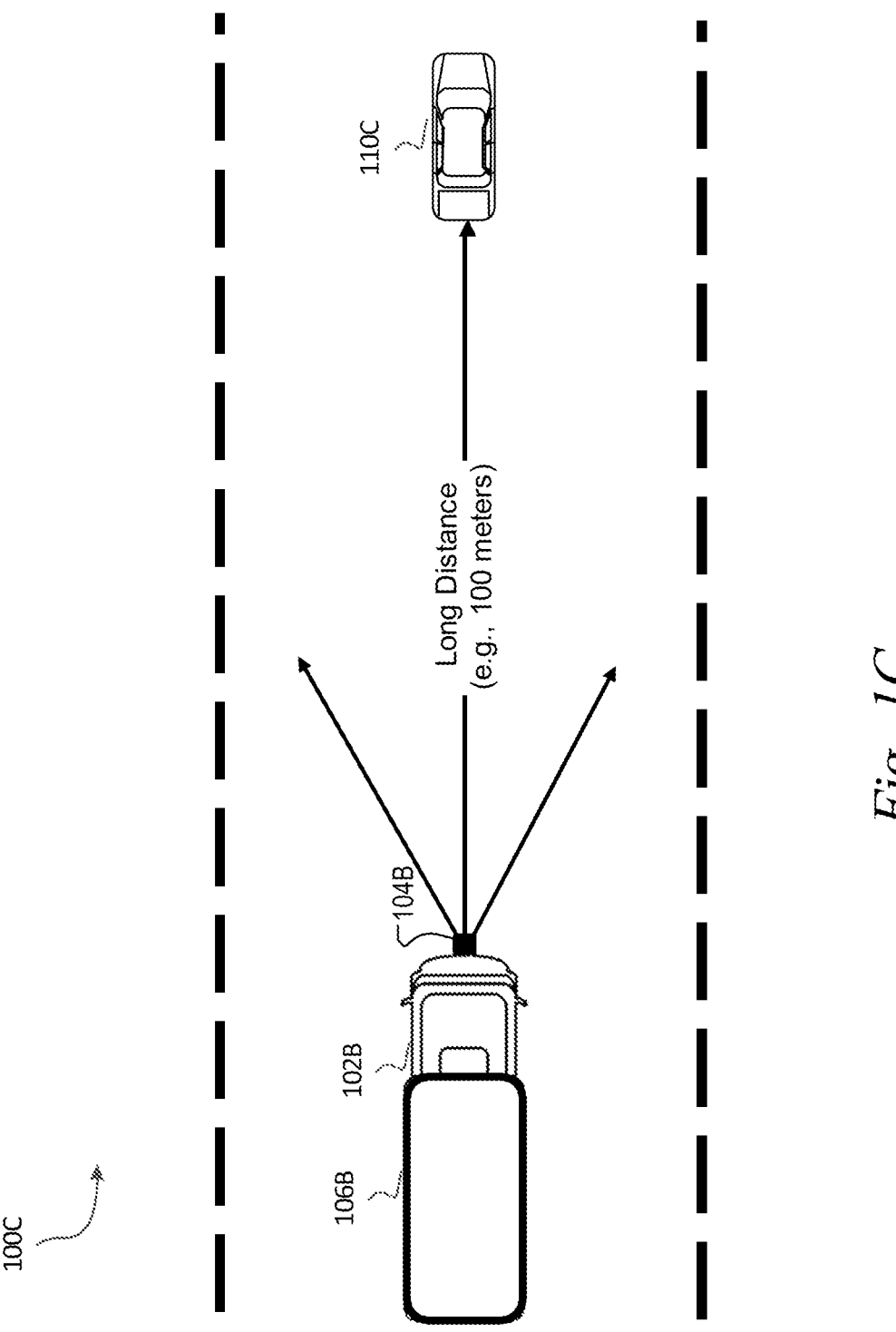
FIG. 1C is a block diagram illustrating an example of a system environment for autonomous commercial trucking vehicles, according to some implementations.

FIG. 1C is a block diagram illustrating an example of a system environment for autonomous commercial trucking vehicles, according to some implementations. The environment 100C includes the same components (e.g., commercial truck 102B, cargo 106B, lidar system 104B, etc.) that are included in environment 100B.

The environment 100C includes an object 110C (shown in FIG. 1C as another vehicle) that is within a distance range that is (i) more than 30 meters and (ii) equal to or less than 150 meters from the commercial truck 102B. As shown, the lidar system 104B in environment 100C may be configured to detect an object (e.g., another vehicle, a bicycle, a tree, street signs, potholes, etc.) at a distance (e.g., 100 meters) from the commercial truck 102B.

Figure 1D:
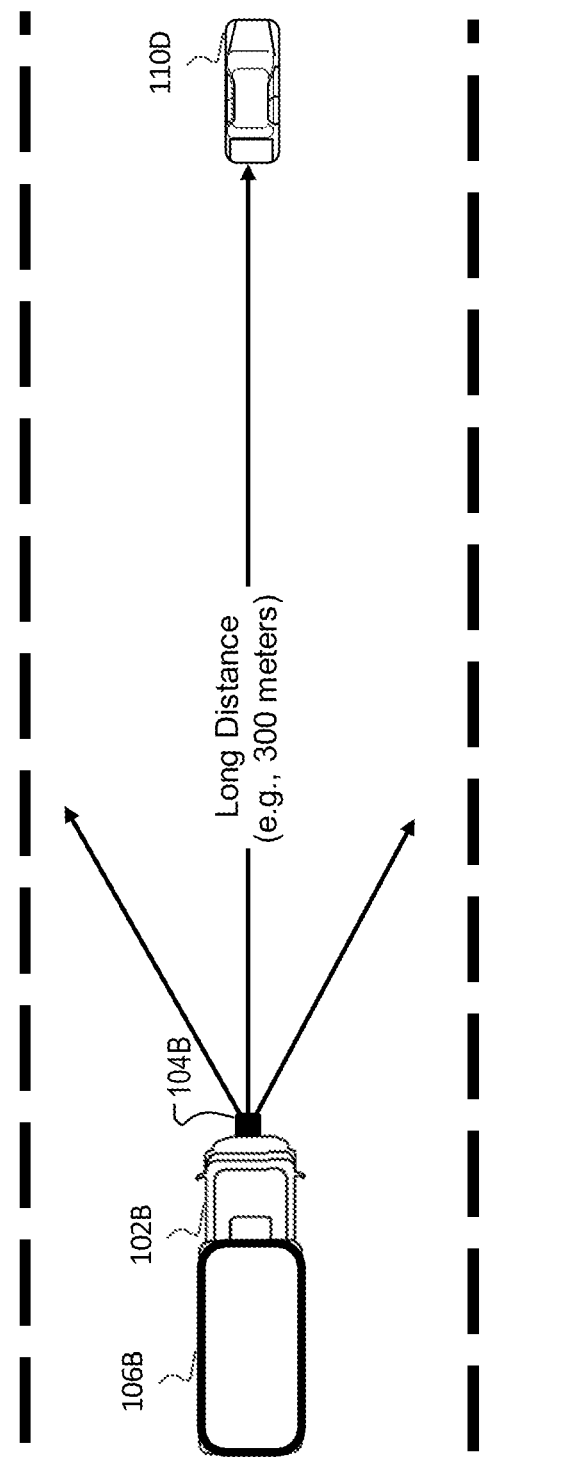
FIG. 1D is a block diagram illustrating an example of a system environment for autonomous commercial trucking vehicles, according to some implementations.

FIG. 1D is a block diagram illustrating an example of a system environment for autonomous commercial trucking vehicles, according to some implementations. The environment 100D includes the same components (e.g., commercial truck 102B, cargo 106B, lidar system 104B, etc.) that are included in environment 100B.

The environment 100D includes an object 110D (shown in FIG. 1D as another vehicle) that is within a distance range that is more than 150 meters from the commercial truck 102B. As shown, the lidar system 104B in environment 100D may be configured to detect an object (e.g., another vehicle, a bicycle, a tree, street signs, potholes, etc.) at a distance (e.g., 300 meters) from the commercial truck 102B.

In commercial trucking applications, it is important to effectively detect objects at all ranges due to the increased weight and, accordingly, longer stopping distance required for such vehicles. FM lidar systems (e.g., FMCW and/or FMQW systems) or PM lidar systems are well-suited for commercial trucking applications due to the advantages described above. As a result, commercial trucks equipped with such systems may have an enhanced ability to safely move both people and goods across short or long distances, improving the safety of not only the commercial truck but of the surrounding vehicles as well. In various implementations, such FM or PM lidar systems can be used in semi-autonomous applications, in which the commercial truck has a driver and some functions of the commercial truck are autonomously operated using the FM or PM lidar system, or fully autonomous applications, in which the commercial truck is operated entirely by the FM or lidar system, alone or in combination with other vehicle systems.

4. Continuous Wave Modulation and Quasi-Continuous Wave Modulation

In a lidar system that uses CW modulation, the modulator modulates the laser light continuously. For example, if a modulation cycle is 10 seconds, an input signal is modulated throughout the whole 10 seconds. Instead, in a lidar system that uses quasi-CW modulation, the modulator modulates the laser light to have both an active portion and an inactive portion. For example, for a 10 second cycle, the modulator modulates the laser light only for 8 seconds (sometimes referred to as, "the active portion"), but does not modulate the laser light for 2 seconds (sometimes referred to as, "the inactive portion"). By doing this, the lidar system may be able to reduce power consumption for the 2 seconds because the modulator does not have to provide a continuous signal.

In Frequency Modulated Continuous Wave (FMCW) lidar for automotive applications, it may be beneficial to operate the lidar system using quasi-CW modulation where FMCW measurement and signal processing methodologies are used, but the light signal is not in the on-state (e.g., enabled, powered, transmitting, etc.) all the time. In some implementations, Quasi-CW modulation can have a duty cycle that is equal to or greater than 1% and up to 50%. If the energy in the off-state (e.g., disabled, powered-down, etc.) can be expended during the actual measurement time then there may be a boost to signal-to-noise ratio (SNR) and/or a reduction in signal processing requirements to coherently integrate all the energy in the longer time scale.

5. Measurement of Range Using Optical Phase-Encoded Signals

Figure 2A:
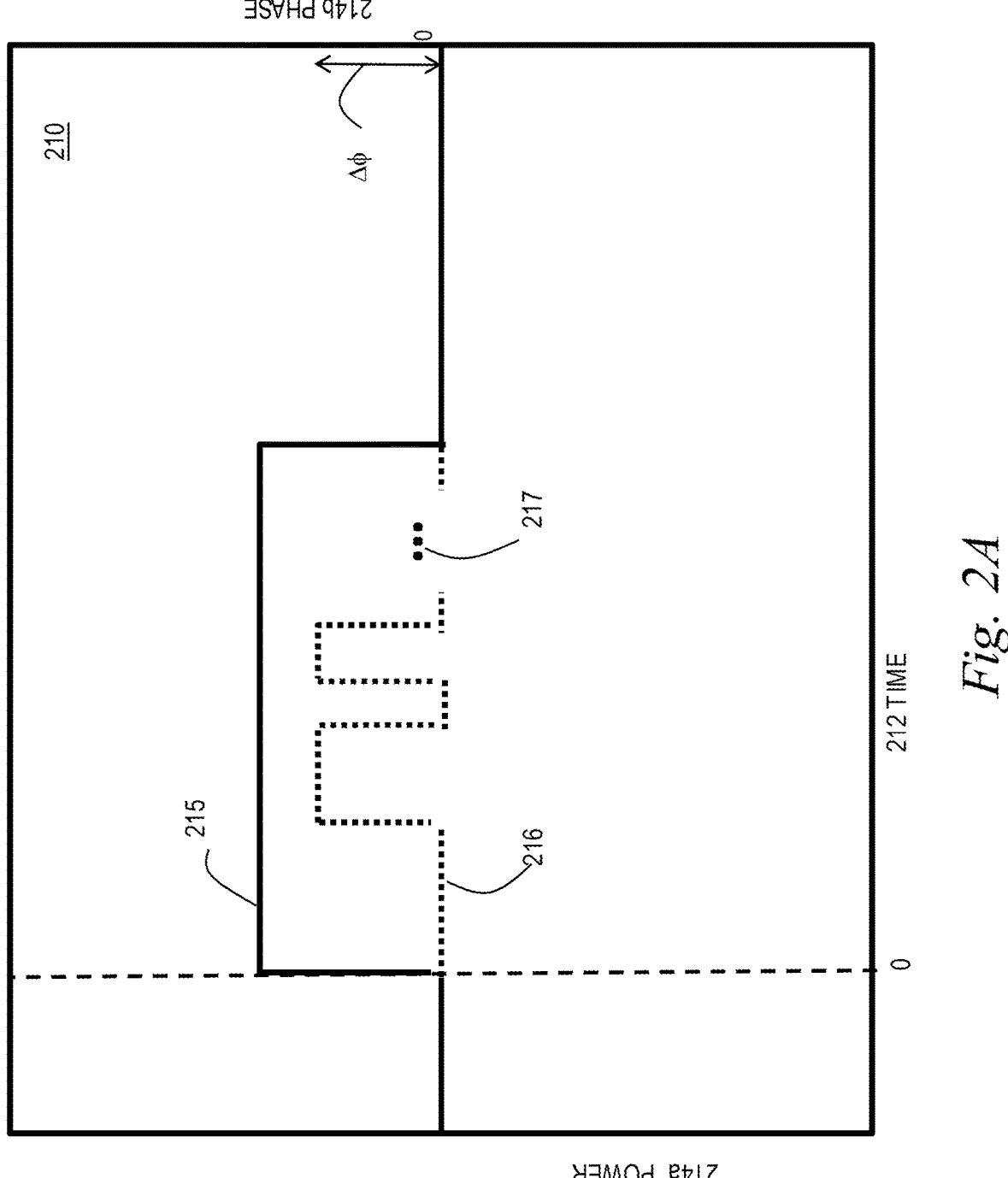
FIG. 2A is a schematic graph that illustrates an example transmitted optical phase-encoded signal for measurement of range, according to some implementations.

FIG. 2A is a schematic graph 210 that illustrates an example transmitted optical phase-encoded signal for measurement of range, according to an embodiment. The horizontal axis 212 indicates time in arbitrary units from a start time at zero. The left vertical axis 214a indicates power in arbitrary units during a transmitted signal; and, the right vertical axis 214b indicates phase of the transmitted signal in arbitrary units. To most simply illustrate the technology of phase-encoded LIDAR, binary phase encoding is demonstrated. Trace 215 indicates the power relative to the left axis 214a and is constant during the transmitted signal and falls to zero outside the transmitted signal. Dotted trace 216 indicates phase of the signal relative to a continuous wave signal.

As can be seen, the trace is in phase with a carrier (phase=0) for part of the transmitted signal and then changes by $\Delta\phi$ (phase=$\Delta\phi$) for short time intervals, switching back and forth between the two phase values repeatedly over the transmitted signal as indicated by the ellipsis 217. The shortest interval of constant phase is a parameter of the encoding called pulse duration t and is typically the duration of several periods of the lowest frequency in the band. The reciprocal, $1/\tau$, is baud rate, where each baud indicates a symbol. The number N of such constant phase pulses during the time of the transmitted signal is the number N of symbols and represents the length of the encoding. In binary encoding, there are two phase values and the phase of the shortest interval can be considered a 0 for one value and a 1 for the other, thus the symbol is one bit, an the baud rate is also called the bit rate. In multiphase encoding, there are multiple phase values. For example, 4 phase values such as $\Delta\phi^*\{0, 1, 2$ and $3\}$, which, for $\Delta\phi=\pi/2$ (90 degrees), equals $\{0, \pi/2, \pi$ and $3\pi/2\}$, respectively; and, thus 4 phase values can represent 0, 1, 2, 3, respectively. In this example, each symbol is two bits and the bit rate is twice the baud rate.

Phase-shift keying (PSK) refers to a digital modulation scheme that conveys data by changing (modulating) the phase of a reference signal (the carrier wave) as illustrated in FIG. 2A. The modulation is impressed by varying the sine and cosine inputs at a precise time. At radio frequencies (RF), PSK is widely used for wireless local area networks (LANs), RF identification (RFID) and Bluetooth communication. Alternatively, instead of operating with respect to a constant reference wave, the transmission can operate with respect to itself. Changes in phase of a single transmitted waveform can be considered the symbol. In this system, the demodulator determines the changes in the phase of the received signal rather than the phase (relative to a reference wave) itself. Since this scheme depends on the difference between successive phases, it is termed differential phase-shift keying (DPSK). DPSK can be significantly simpler to implement than ordinary PSK, since there is no need for the demodulator to have a copy of the reference signal to determine the exact phase of the received signal (it is a non-coherent scheme).

For optical ranging applications, the carrier frequency is an optical frequency fc and a RF $f_r$ is modulated onto the optical carrier. The number N and duration r of symbols are selected to achieve the desired range accuracy and resolution. The pattern of symbols is selected to be distinguishable from other sources of coded signals and noise. Thus a strong correlation between the transmitted and returned signal is a strong indication of a reflected or backscattered signal. The transmitted signal is made up of one or more blocks of symbols, where each block is sufficiently long to provide strong correlation with a reflected or backscattered return even in the presence of noise. In the following discussion, it is assumed that the transmitted signal is made up of M blocks of N symbols per block, where M and N are non-negative integers.

Figures 2B, 2C:
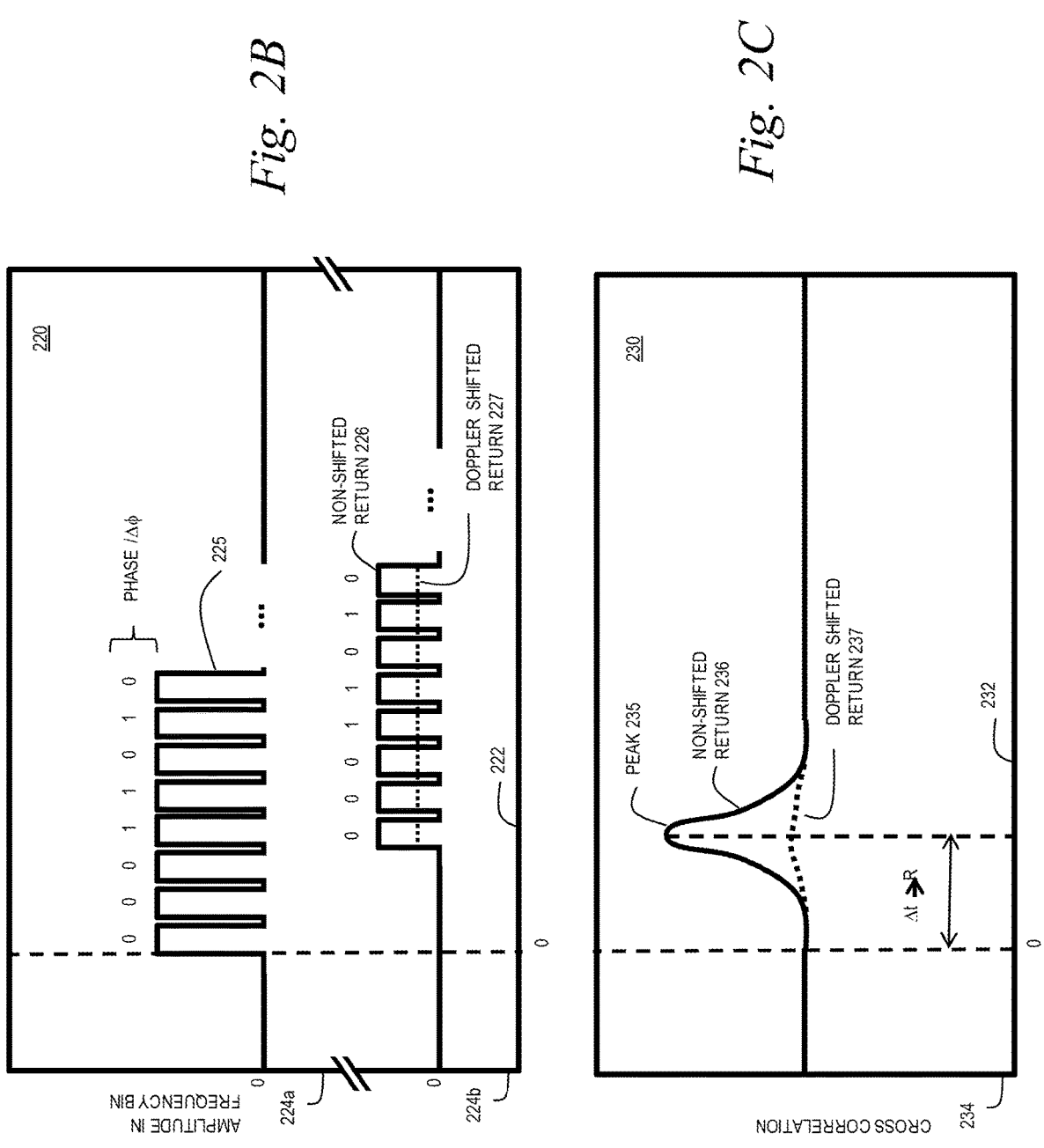
FIG. 2B is a schematic graph that illustrates the example transmitted signal of FIG. 2A as a series of binary digits along with returned optical signals for measurement of range, according to some implementations.
FIG. 2C is a schematic graph that illustrates example cross-correlations of a reference signal with two returned signals, according to some implementations.

FIG. 2B is a schematic graph 220 that illustrates the example transmitted signal of FIG. 2A as a series of binary digits along with returned optical signals for measurement of range, according to an embodiment. The horizontal axis 222 indicates time in arbitrary units after a start time at zero. The vertical axis 224a indicates amplitude of an optical transmitted signal at frequency fc+$f_r$ in arbitrary units relative to zero. The vertical axis 224b indicates amplitude of an optical returned signal at frequency fc+f$_r$ in arbitrary units relative to zero, and is offset from axis 224a to separate traces. Trace 225 represents a transmitted signal of M*N binary symbols, with phase changes as shown in FIG. 2A to produce a code starting with 00011010 and continuing as indicated by ellipsis. Trace 226 represents an idealized (noiseless) return signal that is scattered from an object that is not moving (and thus the return is not Doppler shifted). The amplitude is reduced, but the code 00011010 is recognizable. Trace 227 represents an idealized (noiseless) return signal that is scattered from an object that is moving and is therefore Doppler shifted. The return is not at the proper optical frequency fc+f$_r$ and is not well detected in the expected frequency band, so the amplitude is diminished.

The observed frequency f' of the return differs from the correct frequency f=fc+f$_r$ of the return by the Doppler effect given by Equation 1.

$$f' = \frac{(c+v_o)}{(c+v_s)}f \qquad \text{(Equation 1)}$$

Where c is the speed of light in the medium. Note that the two frequencies are the same if the observer and source are moving at the same speed in the same direction on the vector between the two. The difference between the two frequencies, $\Delta f = f' - f$, is the Doppler shift, $\Delta f_D$, which causes problems for the range measurement, and is given by Equation 2.

$$\Delta f_D = \left[\frac{(c+v_o)}{(c+v_s)} - 1\right]f \qquad \text{(Equation 2)}$$

Note that the magnitude of the error increases with the frequency f of the signal. Note also that for a stationary LIDAR system ($v_s=0$), for an object moving at 10 meters a second ($v_o=10$), and visible light of frequency about 500 THz, then the size of the error is on the order of 16 megahertz (MHz, 1 MHz=$10^6$ hertz, Hz, 1 Hz=1 cycle per second). In various embodiments described below, the Doppler shift error is detected and used to process the data for the calculation of range.

FIG. 2C is a schematic graph 230 that illustrates example cross-correlations of the transmitted signal with two returned signals, according to an embodiment. In phase coded ranging, the arrival of the phase coded reflection is detected in the return by cross correlating the transmitted signal or other reference signal with the returned signal, implemented practically by cross correlating the code for a RF signal with a electrical signal from an optical detector using heterodyne detection and thus down-mixing back to the RF band. The horizontal axis 232 indicates a lag time in arbitrary units applied to the coded signal before performing the cross correlation calculation with the returned signal. The vertical axis 234 indicates amplitude of the cross correlation computation. Cross correlation for any one lag is computed by convolving the two traces, i.e., multiplying corresponding values in the two traces and summing over all points in the trace, and then repeating for each time lag. Alternatively, the cross correlation can be accomplished by a multiplication of the Fourier transforms of each the two traces followed by an inverse Fourier transform. Efficient hardware and software implementations for a Fast Fourier transform (FFT) are widely available for both forward and inverse Fourier transforms. More precise mathematical expression for performing the cross correlation are provided for some example embodiments, below.

Note that the cross correlation computation is typically done with analog or digital electrical signals after the amplitude and phase of the return is detected at an optical detector. To move the signal at the optical detector to a RF frequency range that can be digitized easily, the optical return signal is optically mixed with the reference signal before impinging on the detector. A copy of the phase-encoded transmitted optical signal can be used as the reference signal, but it is also possible, and often preferable, to use the continuous wave carrier frequency optical signal output by the laser as the reference signal and capture both the amplitude and phase of the electrical signal output by the detector.

Trace 236 represents cross correlation with an idealized (noiseless) return signal that is reflected from an object that is not moving (and thus the return is not Doppler shifted). A peak occurs at a time $\Delta t$ after the start of the transmitted signal. This indicates that the returned signal includes a version of the transmitted phase code beginning at the time $\Delta t$. The range R to the reflecting (or backscattering) object is computed from the two way travel time delay based on the speed of light c in the medium, as given by Equation 3.

$$R=c*\Delta t/2 \qquad \text{(Equation 3)}$$

Figures 2D, 2E:
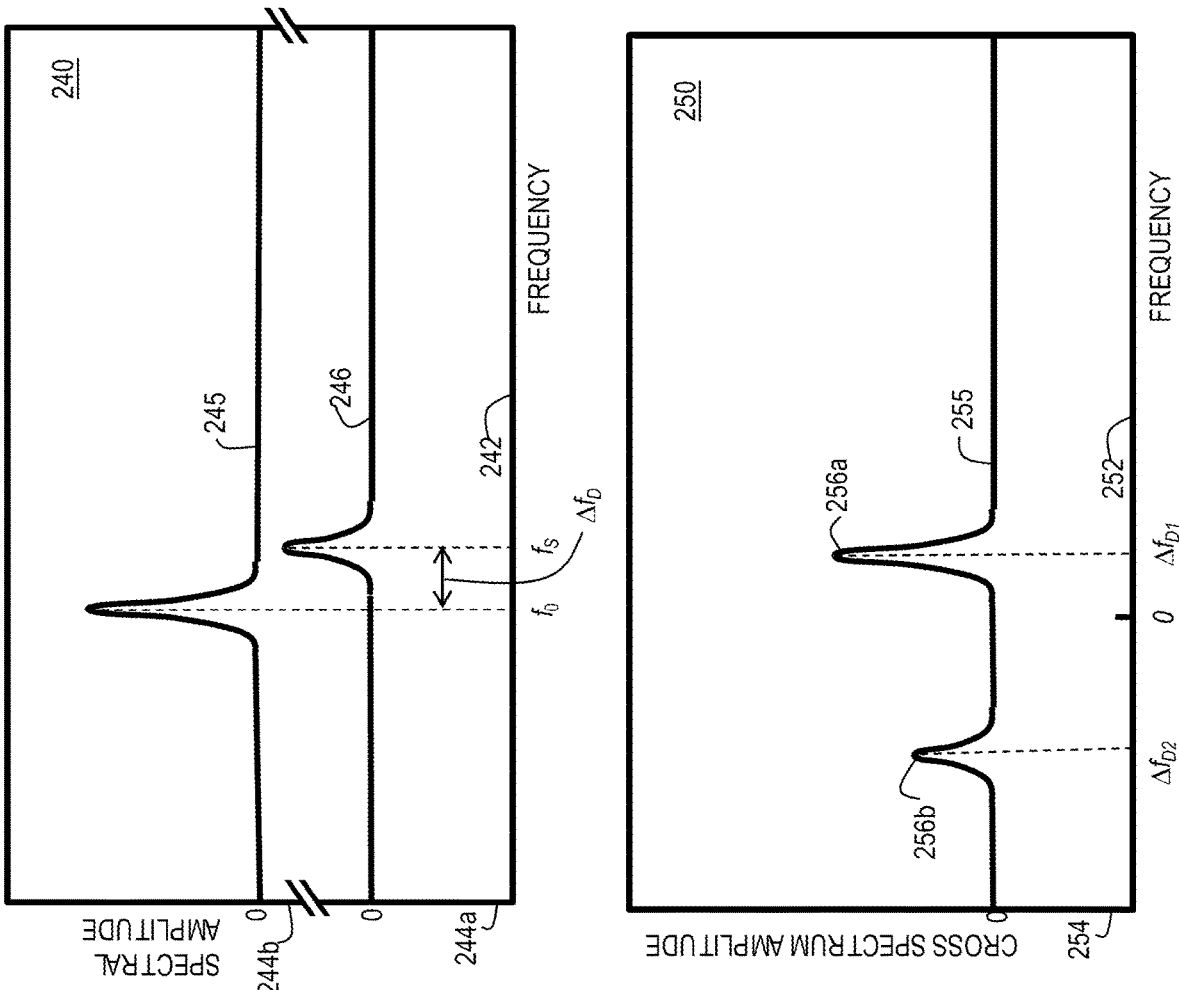
FIG. 2D is a schematic graph that illustrates an example spectrum of the reference signal and an example spectrum of a Doppler shifted return signal, according to some implementations.
FIG. 2E is a schematic graph that illustrates an example cross-spectrum of phase components of a Doppler shifted return signal, according to some implementations.

According to various embodiments described in more detail below, the Doppler shift is determined in the electrical processing of the returned signal; and the Doppler shift is used to correct the cross correlation calculation. Thus a peak is more readily found and range can be more readily determined. FIG. 2D is a schematic graph 240 that illustrates an example spectrum of the transmitted signal and an example spectrum of a Doppler shifted return signal, according to an embodiment. The horizontal axis 242 indicates RF frequency offset from an optical carrier fc in arbitrary units. The vertical axis 244a indicates amplitude of a particular narrow frequency bin, also called spectral density, in arbitrary units relative to zero. The vertical axis 244b indicates spectral density in arbitrary units relative to zero, and is offset from axis 244a to separate traces. Trace 245 represents a transmitted signal; and, a peak occurs at the proper RF f$_0$. Trace 246 represents an idealized (noiseless) return signal that is backscatter from an object that is moving and is therefore Doppler shifted. The return does not have a peak at the proper RF f$_0$; but, instead, is blue shifted by $\Delta f_D$ to a shifted frequency f$_S$.

In some Doppler compensation embodiments, rather than finding $\Delta f_D$ by taking the spectrum of both transmitted and returned signals and searching for peaks in each, then subtracting the frequencies of corresponding peaks, as illustrated in FIG. 2D, it is more efficient to take the cross spectrum of the in-phase and quadrature component of the down-mixed returned signal in the RF band. FIG. 2E is a schematic graph 250 that illustrates an example cross-spectrum, according to an embodiment. The horizontal axis 252 indicates frequency shift in arbitrary units relative to the reference spectrum; and, the vertical axis 254 indicates amplitude of the cross spectrum in arbitrary units relative to zero. Trace 255 represents a cross spectrum with an idealized (noiseless) return signal generated by one object moving toward the LIDAR system (blue shift of $\Delta f_{D1}=\Delta f_D$ in FIG. 2D) and a second object moving away from the LIDAR system (red shift of $\Delta f_{D2}$). A peak occurs when one of the components is blue shifted $\Delta f_{D1}$; and, another peak occurs when one of the components is red shifted $\Delta f_{D2}$. Thus the Doppler shifts are determined. These shifts can be used to determine a velocity of approach of objects in the vicinity of the LIDAR, as can be critical for collision avoidance applications.

As described in more detail below, the Doppler shift(s) detected in the cross spectrum are used to correct the cross correlation so that the peak 235 is apparent in the Doppler compensated Doppler shifted return at lag Δt, and range R can be determined. The information needed to determine and compensate for Doppler shifts is either not collected or not used in prior phase-encoded LIDAR systems.

6. a Lidar System Using a Digital Down Converter

FIG. 3A is a block diagram illustrating an example of a software-defined radio (SDR) system 300 including a transmit (TX)-side DSP 310, a digital-to-analog converter (DAC) 301, an analog-to-digital converter (ADC) 306, RF hardware 302 (e.g., RF tuners, amplifiers, frequency multipliers, filters, etc.), an antenna 304, and a receive (RX)-side DSP 320. The TX-side DSP 310 may include a direct digital synthesizer (DDS) 314, two digital multipliers (or digital mixer) 312, 316, and a digital adder 318. The RX-side DSP 320 may include a DDS 326, two digital multipliers (or digital mixer) 322, 324, and two digital filters (LPF, down sampler or decimator, etc.) 328, 330. The RX-side DSP 320 may perform a digital down conversion (DDC).

In a SDR transmitter, the TX-side DSP 310 may perform IQ modulation. The DSP 310 may receive I data stream 311 and Q data stream 315. The DDS 314 may receive the baseband carrier wave (LO signal 313) as an I carrier, and apply a 90° phase shift to the I carrier to generate a Q carrier. The digital multiplier 312 may multiply the I carrier by the I data stream, and the digital multiplier 316 may multiply the Q carrier by the Q data stream Q carriers. The digital adder 318 may sum two signals resulting from these multiplications to produce a modulated waveform (e.g., frequency modulated (FM) waveform). The modulated waveform may be converted to an analog signal by the DAC 301. The analog signal may then be shifted in a different frequency by a frequency multiplier in the RF hardware 362, and delivered to the antenna 304 as an output signal to be transmitted.

An SDR receiver may receive an input signal and use an RF tuner in the RF hardware 302 to down convert the input signal from a frequency band of interest to an intermediate frequency (IF) within the range of the ADC 306. From that point on, the RX-side DSP 320 may perform a digital down conversion (DDC) to translate the signal frequency of an output of the ADC 306 (digital output) to baseband and perform a low-pass filtering (LPF) function. The DDS 326 may receive the baseband carrier wave (LO signal 327) as an I carrier, and apply a 90° phase shift to the I carrier to generate a Q carrier. The digital mixer 322 may down convert the digital output by mixing the I carrier with the digital output. Similarly, the digital mixer 324 may down convert the digital output by mixing the Q carrier with the digital output. The filter 328 may perform an LPF on an output of the digital mixer 322 to eliminate a high-frequency component and/or down-sample (or decimate) the output of the digital mixer 322 to reduce the sample rate, to produce baseband I data 329. Similarly, the filter 330 may perform an LPF on an output of the digital mixer 324 to eliminate a high-frequency component and/or down-sample (or decimate) the output of the digital mixer 324 to reduce the sample rate, to produce baseband Q data 331.

FIG. 3A shows an example of DDC system to down convert an RF signal to a baseband signal, according to some implementations. However, there is a need for a mechanism to use such DDC system to down convert an optical signal to a baseband signal. FIG. 3B shows an example of a lidar sensor system that can down convert an optical signal to a baseband signal.

FIG. 3B is a block diagram illustrating an example of a lidar sensor system 340, according to some implementations, which includes a laser source 342, a local oscillator 344, an optical modulator 352, circulator optics 346, a scanner 348, an optical hybrid 358, a pair of detectors 360, a pair of detectors 362, ADCs 364, 366, and a DSP system 370 including (digital) filters 372, 374. The laser 342 may generate a beam which is oscillated by the local oscillator 344 to output an optical LO signal 349 as carrier wave. The optical modulator 352 may receive input data stream 351 and process the data stream as two parallel data streams, I and Q data streams (not shown). The optical modulator 352 may receive the carrier wave (LO signal 349) as an I carrier, and apply a 90° phase shift to the I carrier to generate a Q carrier. The optical modulator 352 may multiply the I and Q carriers by the I and Q data streams, respectively, and sum two signals resulting from these multiplications to produce a modulated waveform. The optical modulator 352 may apply a bias control 353 to perform amplitude modulation and/or phase modulation of the I and Q carriers based on the I and Q data streams to generate a modulated optical signal.

The circulator optics 346 may receive the modulated optical signal, which is input to the scanner 348 as a transmit signal. The transmit signal may be transmitted through the scanner 348 to illuminate an object 350 (or an area of interest). The scanner 348 may receive a return optical signal reflected by the object 350. The six-port 90° optical hybrid 358 may receive the return optical signal as an optical signal 355 through the circulator optics 346, and receive an optical LO signal 317. The optical hybrid 358 may mix the optical signal 355 with four quadratural states associated with the optical LO (reference) signal 317 in a complex-field space to generate four light signals. The optical hybrid 358 may down convert the optical signal 355 to generate down-converted four light signals. The optical hybrid 358 may then deliver the four light signals to the two pairs of balanced detectors 360 and 362. The two pairs of detectors 360 and 362 may transmit output signals to the ADCs 364, 366 via first and second channels, respectively. In the first channel, the ADC 364 may generate a digital signal which is processed by the filter 372 (e.g., low-pass filter (LPF), amplifier, etc.) to output I data 373. Similarly, in the second channel, the ADC 366 may generate a digital signal which is processed by the filter 374 (e.g., low-pass filter (LPF), amplifier, etc.) to output Q data 375.

Figure 3C:
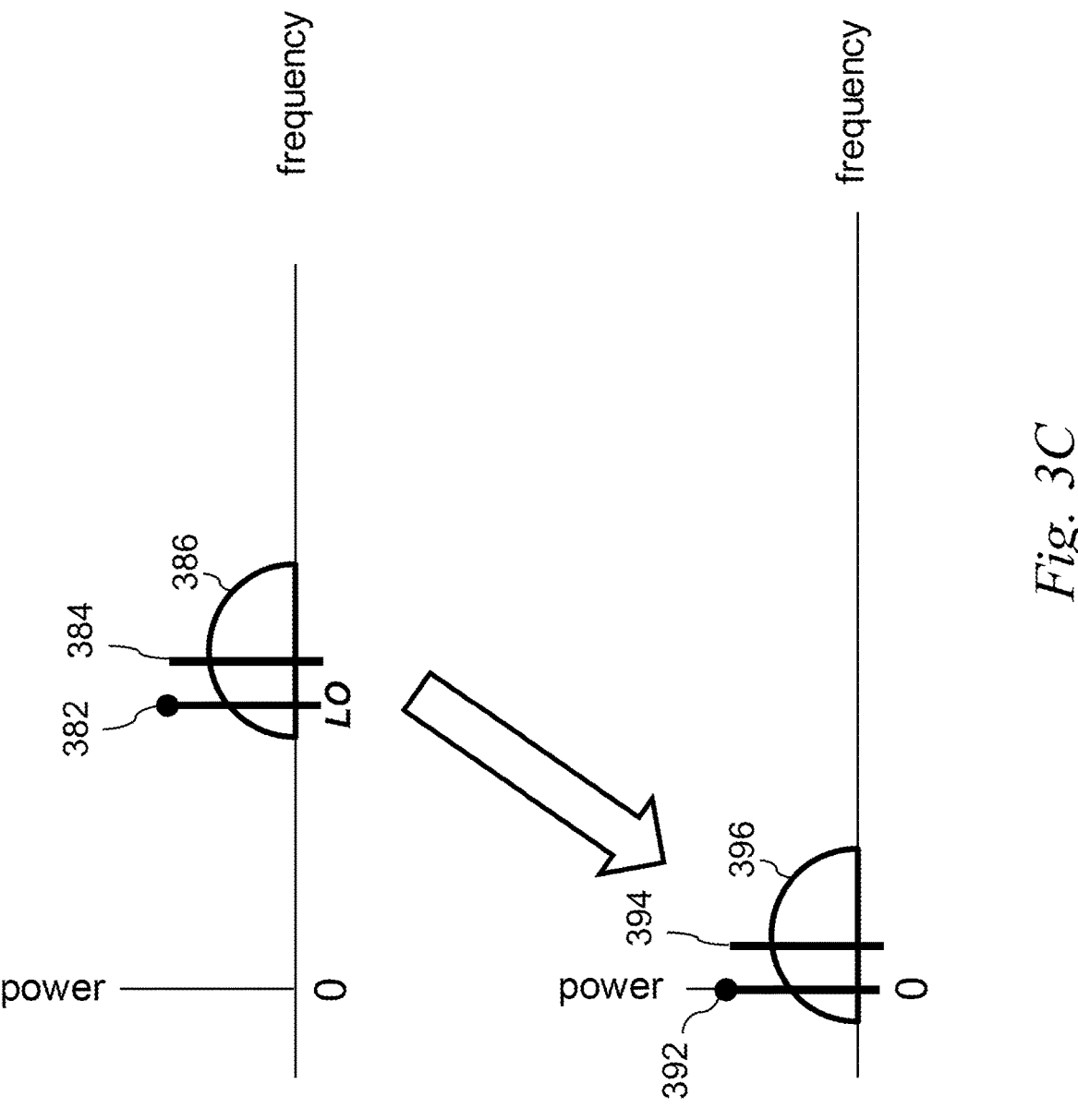
FIG. 3C is a block diagram illustrating an example of down converting a signal to a lower frequency signal, according to some implementations.

FIG. 3C is a block diagram illustrating an example of down converting a signal to a lower frequency signal, according to some implementations. For example, a lidar sensor system (e.g., lidar sensor system 340) may perform IQ modulation of an LO signal having an LO frequency 382 based on an input data stream to produce a modulated waveform, transmit the modulated waveform as a transmit (TX) signal, and receive a receive (RX) signal 386 reflected from an object (e.g., optical return signal in the lidar sensor system). The RX signal 386 may have a center frequency 384 different from the LO frequency 382. An optical detection device (e.g., optical hybrid 358) of the lidar sensor system may down convert the RX signal 386 from the LO frequency 382 to a zero frequency (or direct-current (DC) frequency) 392 to output a down-converted signal 396 having a center frequency 394. In this manner, the information carried by the RX signal 386 in a region crossing through the LO frequency 382 may be reflected in the down-converted signal 396 around the DC frequency 392, having both positive and negative frequencies. In other words, two baseband frequency regimes (or two sidebands) of the RX signal 386 may be converted to positive and negative frequency ranges of the down-converted signal 396 around the DC frequency 392.

The lidar sensor system may then measure a phase difference between the TX signal and the RX signal to calculate a range to the object or a velocity of the object (see FIG. 2A to FIG. 2E). As the down-converted signal 396 has both positive and negative frequencies, the lidar sensor system (e.g., DSP system 370 of lidar sensor system 340) may need to perform two separate measurements or comparisons in the ranges of positive and negative frequencies. For example, a DSP system of the lidar sensor system (e.g., DSP system 330) may need to compare I/Q components of the down-converted signal 396 in the positive frequency range with I/Q components of the TX signal in the upper sideband, and compare I/Q components of the down-converted signal 396 in the negative frequency range with I/Q components of the TX signal in the lower sideband. This may make the information carried in the region crossing through the LO frequency 382 (in the RX signal 386) ambiguous, e.g., making it difficult to accurately measure or detect the phase difference between the TX signal and the RX signal in that region crossing through the LO frequency 382. Moreover, when the positive and negative frequency ranges of the down-converted signal 396 are input to detectors (e.g., detectors 360, 362), the detectors may suffer from an artifact at the zero (DC) frequency due to electronic 1/f noise and a flat frequency response of the detectors. This may happen when the lidar sensor system has the same speed as the object or vehicle (e.g., a target with zero Doppler).

As shown in FIG. 3B, in a lidar sensor system, optical IQ sampling may rely on having complex circuitry, for example, multiple channels for detection, digitization, and/or amplification, and complex optical systems like optical hybrids (e.g., optical hybrid 358). In some cases, the cost of a lidar sensor system may be relatively high due to processing of two baseband frequency regimes (e.g., separate spectral sidebands) using such complex circuitry. Moreover, as shown in FIG. 3C, in a lidar sensor system, it may be difficult to accurately measure or detect a phase difference between a transmit (TX) signal and a receive (RX) signal because down-converted signals have both positive and negative frequency regions.

To solve these problem, in some implementations, a lidar sensor system (e.g., FMCW or other coherent lidar sensor systems) may improve a signal processing technique for IQ sampling by filtering an RX signal using a digital down conversion (DDC). Instead of relying on complex circuitry like multiple detection and digitization channels and optical hybrids, DDC in the lidar sensor system can achieve IQ sampling while only using a single detection and digitization detection channel without using optical hybrids. In some implementations, the lidar sensor system may generate or create a transmit optical waveform that is frequency-shifted relative to a local oscillator (LO) frequency. The lidar sensor system may generate such an optical waveform using multiple methods, for example, using a nested Mach-Zehnder electro-optic modulator.

In some implementations, the lidar sensor system may determine a frequency offset ($f_o$) between a transmit (TX) optical signal and a local oscillator (LO), generate an optical signal with its frequency shifted from the LO frequency by the frequency offset ($f_o$), and perform modulation (e.g., IQ modulation) based on the frequency-shifted optical signal.

The lidar sensor system may include a DSP system for sampling (e.g., IQ sampling) and detection with respect to a receive (RX) optical signal, and synchronize the optical modulation and frequency offset with the DSP. The DSP system may include a DDC system. The lidar sensor system may include only a single ADC channel to retrieve full phase/amplitude information of the RX optical signal.

In some implementations, the lidar sensor system may mix the RX optical signal with an LO signal using an optical mixer to produce an optical signal, which may be then detected by one or more detectors (e.g., a pair of balanced detectors) and digitized by a digitizer (e.g., ADC), producing a digital signal of interest. The resulting digital signal of interest may include strictly positive frequency content because the RX optical signal may have a frequency range that has been shifted by the frequency offset ($f_o$) from the LO frequency. The DDC system of the lidar sensor system may extract a full complex signal (e.g., I/Q components) from the digital signal. The DDC system may digitally mix the digital signal to produce I data and Q data and recombine the I/Q data into a complex signal. If s(t) and s'(t) denote the original digital signal and the complex signal, respectively, and I (t) and Q (t) denote the I data and Q data, respectively, the DDC system may perform the step of generating the complex signal s'(t) according to the following equations:

$$I(t)=LP[\sin\ (2\pi f_o t)\times s(t)] \qquad \text{(Equation 4)}$$

$$Q(t)=-1\times LP[\cos\ \cos\ (2\pi f_o t)\times s(t)] \qquad \text{(Equation 5)}$$

$$s'(t)=I(t)+1j\ Q(t) \qquad \text{(Equation 6)}$$

where 1j is the imaginary unit, $f_o$ is the frequency offset of the TX optical waveform, LP[ ] is a low pass filtering operation. After performing this step, the lidar sensor system may deliver the s'(t) signal to another DSP system. The DSP system may bandpass filtered (e.g., by a bandpass filter) and/or down-sample or decimate (e.g., by down-sampler) the s'(t) signal as dictated by signal processing needs.

In some implementations, the lidar sensor system may generate codes on frequency-shifted carriers (e.g., an optical waveform that is shifted by a frequency offset ($f_o$) relative to a source LO; hereinafter referred to as "$f_o$-shifted waveform") using a plurality of methods. The methods may include (1) optical single-sideband generation using a nested Mach-Zehnder electro-optic modulator, (2) serrodyne shifting with an electro-optic modulator, (3) optical phase-lock loop with two separate lasers, (4) optical injection locking with two separate lasers, or (5) using acousto-optic modulators. In some implementations, the lidar sensor system may include a chip (e.g., analog integrated circuits (IC) chip) implementing or integrating at least of the methods (1)-(5). The chip may be an integrated circuits (IC) chip (e.g., analog or digital IC chip) or integrated photonics in which waveguides and/or optical devices are fabricated as an integrated structure onto a surface of a flat substrate, or flat surface.

In some implementations, the lidar sensor system may generate a $f_o$-shifted waveform in a single sideband (e.g., upper sideband) using a nested Mach-Zehnder electro-optic modulator (e.g., optical IQ modulator or QPSK modulator; hereinafter referred to as "nested MZ modulator"). In some implementations, a nested MZ modulator may provide a complete digital control and/or single step upshifting and waveform modulation to flexibly perform a single sideband generation of a $f_o$-shifted waveform.

In some implementations, the lidar sensor system may generate a $f_o$-shifted waveform using serrodyne shifting with an electro-optic modulator. In some implementations, an electro-optic phase modulator may be driven by a high-frequency sawtooth waveform to perform serrodyne frequency shifting of an optical signal by a frequency offset. This serrodyne shifting method may be amenable to integrated photonics.

In some implementations, the lidar sensor system may generate a $f_o$-shifted waveform using an optical phase-lock loop with two separate lasers. In some implementations, the optical phase-lock loop may synchronize relative phases of two laser beams and stabilize the beams with an adjustable frequency difference (e.g., a desired frequency offset) while their phase relation remains constant. This method of optical phase-lock loop may be amenable to integrated photonics.

In some implementations, the lidar sensor system may generate a $f_o$-shifted waveform using an optical injection locking with two separate lasers (e.g., a master laser and a slave laser). In some implementations, the optical injection locking may drive a master laser to be directly modulated by a reference (e.g., LO signal) with its output injected into a slave laser. The slave laser may be wavelength-locked with sidebands from the output of the master laser. Unlike the optical phase-lock loop, the optical injection locking may be performed without feedback electronics. This method of optical injection locking may be amenable to integrated photonics.

In some implementations, the lidar sensor system may generate a $f_o$-shifted waveform using an acousto-optic modulator. In some implementations, the acousto-optic modulator may be an acousto-optic frequency shifter (AOFS). The lidar sensor system may drive the AOFS with a drive frequency (e.g., LO frequency) such that transmission of an input optical signal through the AOFS may cause the input optical signal to experience a frequency shift equal to the drive frequency.

In some implementations, the lidar sensor system can provide full IQ sampling which can separate between positive and negative frequency content of an RX signal relative to the corresponding TX signal (e.g., signed Doppler frequency shift), thereby preserving capability of detecting a sign of velocity of an object (e.g., vehicle). For example, a DSP system of the lidar sensor system may compare I/Q components of a down-converted signal (which still lies in the positive frequency range) with I/Q components of the TX signal with respect to the frequency offset. In this manner, the lidar sensor system can detect positive or negative Doppler frequency shift between the TX signal and the RX signal for signed Doppler and phase tracking of signals for advanced target discrimination and interference mitigation.

According to certain aspects, implementations in the present disclosure relate to light detection and ranging (lidar) sensor system. The lidar sensor system may include a laser source configured to generate a beam, and one or more processors. The one or more processors may be configured to generate, based on the beam, an optical signal that is frequency-shifted by a frequency offset relative to a local oscillator (LO) signal. The one or more processors may be configured to transmit the optical signal to an environment. In response to transmitting the optical signal, the one or more processors may be configured to receive a returned optical signal that is reflected from an object in the environment. The one or more processors may be configured to generate a digital signal based on the received signal. The one or more processors may be configured to digitally mix the digital signal based on the frequency offset to generate a sample signal. The one or more processors may be configured to determine, based on the sample signal, a range to the object.

In some implementations, the lidar sensor system may further include a nested Mach-Zehnder electro-optic modulator. The one or more processors may be configured to generate the optical signal by performing an optical single-sideband modulation of the beam using the nested Mach-Zehnder electro-optic modulator.

In some implementations, the lidar sensor system may include an electro-optic modulator. The one or more processors may be configured to generate the optical signal by performing a serrodyne frequency shifting on the beam using the electro-optic modulator.

In some implementations, the laser source may include two lasers configured in an optical phase-lock loop. The one or more processors may be configured to generate the optical signal by stabilizing the two lasers with the frequency offset using the optical phase-lock loop.

In some implementations, the laser source may include two lasers configured in an optical injection locking. The one or more processors may be configured to generate the optical signal by performing a sideband modulation of the beam using the optical injection locking.

In some implementations, the one or more processors may be configured to generate the digital signal by (1) optically mixing the received signal with the LO signal, (2) detecting the optically mixed signal, and (3) digitizing the detected signal.

In some implementations, the one or more processors are configured to generate the digital signal based on the received signal through a single channel of detection and digitization.

In some implementations, the one or more processors are configured to digitally mix the digital signal by (1) multiplying a first waveform with the digital signal to generate a first mixed signal and (2) multiplying a second waveform with the digital signal to generate a second mixed signal. Each of the first and second waveforms may have a frequency corresponding to the frequency offset. The one or more processors may be configured to generate the sample signal by (1) performing a low pass filtering on the first mixed signal and (2) performing a low pass filtering on the second mixed signal. The one or more processors may be configured to generate the sample signal by (1) down-sampling the first mixed signal and (2) down-sampling the second mixed signal.

According to certain aspects, implementations in the present disclosure relate to an autonomous vehicle control system. The autonomous vehicle control system may include one or more processors and one or more computer-readable storage mediums. The mediums may store instructions which, when executed by the one or more processors, cause the one or more processors to generate, based on a beam generated from a laser source, an optical signal that is frequency-shifted by a frequency offset relative to a local oscillator (LO) signal. The one or more processors may be configured to transmit the optical signal to an environment. In response to transmitting the optical signal, the one or more processors may be configured to receive a returned optical signal that is reflected from an object in the environment. The one or more processors may be configured to generate a digital signal based on the received signal. The one or more processors may be configured to digitally mix the digital signal based on the frequency offset to generate a sample signal. The one or more processors may be configured to determine, based on the sample signal, a range to the object. The one or more processors may be configured to control operation of a vehicle using the range to the object.

In some implementations, the one or more processors are configured to generate the digital signal by (1) optically mixing the received signal with the LO signal, (2) detecting the optically mixed signal, and (3) digitizing the detected signal.

In some implementations, the one or more processors are configured to generate the digital signal based on the received signal through a single channel of detection and digitization.

In some implementations, the one or more processors are configured to digitally mix the digital signal by (1) multiplying a first waveform with the digital signal to generate a first mixed signal and (2) multiplying a second waveform with the digital signal to generate a second mixed signal. Each of the first and second waveforms may have a frequency corresponding to the frequency offset. The one or more processors may be configured to generate the sample signal by (1) performing a low pass filtering on the first mixed signal and (2) performing a low pass filtering on the second mixed signal. The one or more processors may be configured to generate the sample signal by (1) down-sampling the first mixed signal and (2) down-sampling the second mixed signal.

According to certain aspects, implementations in the present disclosure relate to an autonomous vehicle. The autonomous vehicle may include at least one of a steering system or a braking system, and a vehicle controller including one or more processors. The one or more processors may be configured to generate, based on a beam generated from a laser source, an optical signal that is frequency-shifted by a frequency offset relative to a local oscillator (LO) signal. The one or more processors may be configured to transmit the optical signal to an environment. In response to transmitting the optical signal, the one or more processors may be configured to receive a returned optical signal that is reflected from an object in the environment. The one or more processors may be configured to generate a digital signal based on the received signal. The one or more processors may be configured to digitally mix the digital signal based on the frequency offset to generate a sample signal. The one or more processors may be configured to determine, based on the sample signal, a range to the object. The one or more processors may be configured to control the at least one of the steering system or the braking system using the range to the object.

In some implementations, the one or more processors may be configured to digitally mix the digital signal by (1) multiplying a first waveform with the digital signal to generate a first mixed signal and (2) multiplying a second waveform with the digital signal to generate a second mixed signal. Each of the first and second waveforms may have a frequency corresponding to the frequency offset. The one or more processors may be configured to generate the sample signal by (1) performing a low pass filtering on the first mixed signal and (2) performing a low pass filtering on the second mixed signal. The one or more processors may be configured to generate the sample signal by (1) down-sampling the first mixed signal and (2) down-sampling the second mixed signal.

Various implementations in the present disclosure have one or more of the following advantages and benefits.

First, implementations in the present disclosure can provide useful techniques for using a digital down conversion (DDC) system in a lidar sensor system (e.g., a coherent lidar system) to enable full IQ sampling of an RX optical signal with less hardware components than lidar sensor systems which include an optical hybrid, at least two pairs of detectors, and at least two ADCs. For example, a lidar sensor system according to some implementations may enable full IQ sampling without an optical hybrid (or any hardware configured to process DC frequency components in the receiver-side lidar sensor system) and using only a single channel for detection and digitization (e.g., a single detector and a single ADC).

Second, implementations in the present disclosure can provide useful techniques for generating a frequency-shifted TX signal. For example, a frequency-shifted TX signal in a single sideband (e.g., upper sideband) may be generated by use of a nested Mach-Zehnder modulator, thereby providing Tx modulation flexibility. That is, single sideband generation of a frequency-shifted TX signal may provide a mechanism for full phase, frequency, and amplitude modulation to enable advanced radar/lidar encoding schemes. Unlike a lidar sensor system which processes two baseband frequency regimes (e.g., both lower and upper sidebands), a lidar sensor system according to some implementations may process a frequency-shifted TX signal in a single sideband (e.g., only in an upper sideband). Unlike a software-defined radio (SDR) system in which a baseband carrier is modulated and then is frequency shifted, a lidar sensor system according to some implementations may optically frequency shift an optical signal and then modulate the frequency-shifted optical signal.

Third, implementations in the present disclosure can provide useful techniques for configuring or causing a DDC system to place or shift a detection band away from a DC frequency for suppression of electronic 1/f noise and flatter response of RF electronics. Compared to a lidar sensor system in which down-converted signals have both positive and negative frequency regions or ranges, the DDC system according to some implementations may place down-converted signals only in a positive frequency region or range, thereby (1) more accurately detecting or measuring the phase difference between the TX signal and the RX signal in a region crossing through the LO frequency without ambiguity, (2) preventing detectors from experiencing an artifact at the zero (DC) frequency due to electronic 1/f noise and a flat frequency response of the detectors, and (3) making the DSP processing more simple than an optical mixing using optical hybrids.

Fourth, implementations in the present disclosure can provide useful techniques for detecting positive and negative frequency content (e.g., Doppler frequency shift) in the signal for signed Doppler and phase tracking of signals for advanced target discrimination and interference mitigation. A lidar sensor according to some implementations can provide full IQ sampling which can separate between positive and negative frequency content, thereby preserving capability of detecting a sign of velocity of an object (e.g., vehicle).

Figure 4B:
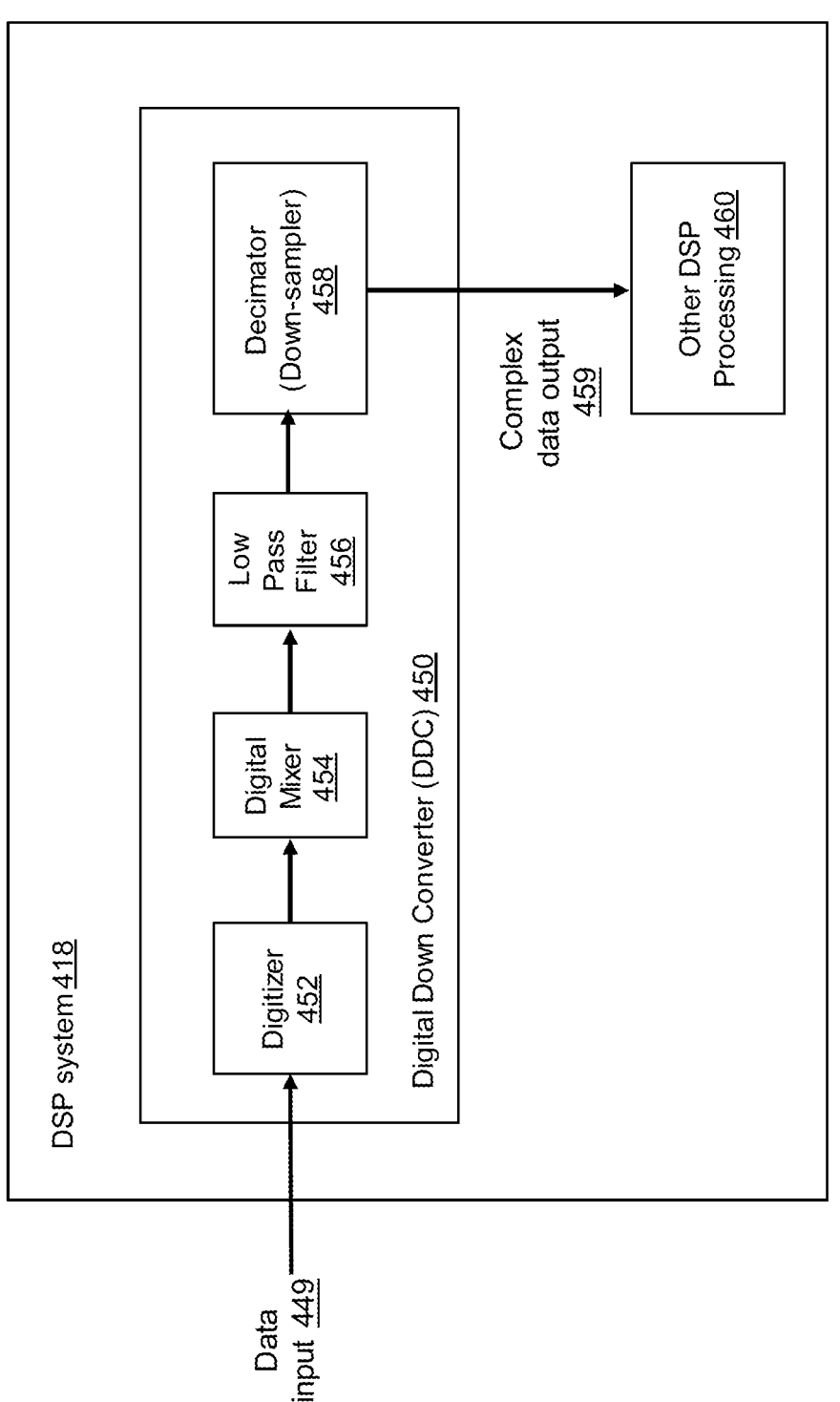
FIG. 4B is a block diagram illustrating an example of a digital signal processing system in a lidar sensor system, according to some implementations.

FIG. 4A is a block diagram illustrating an example of a lidar sensor system 400, according to some implementations. The lidar sensor system 400 may include a laser source 402, a local oscillator 412, a frequency-shifting optical modulator 404, circulator optics 406, a scanner 408, an optical mixer 414, one or more detectors 416 (e.g., a pair of detectors), and a DSP system 418. FIG. 4B is a block diagram illustrating an example of the DSP system 418 in a lidar sensor system, according to some implementations. The DSP system 418 may include a DDC system 450 and other DSP components 460. The DDC system 450 may include a digitizer 452 (e.g., ADC), a digital mixer 454 (e.g., a direct digital synthesizer (DDS), digital multipliers), a low pass filter 456, and a down-sampler 458. In some implementations, DSP system 418 may include circuits or one or more processors (e.g., processor 710 in FIG. 7) configured to perform demodulation, decoding, and related tasks. These circuits may be generally based on application-specific ICs (ASICs), field-programmable gate arrays (FPGAs) and programmable DSP devices.

Referring to FIG. 4A, the laser 402 may generate a beam which is oscillated by the local oscillator 412 to output an optical LO signal. In some implementations, the frequency shifting optical modulator 404 may determine a frequency offset ($f_o$) between a transmit (TX) optical signal and the optical LO signal, generate an optical signal with its frequency shifted from the LO frequency by the frequency offset ($f_o$), and perform modulation (e.g., IQ modulation) of the frequency-shifted optical signal (hereinafter referred to as "$f_o$-shifted waveform") based on a data signal (e.g., I/Q data signal) to generate a transmit (TX) optical waveform 405. In some implementations, the frequency shifting optical modulator 404 may generate a $f_o$-shifted waveform using a plurality of methods. The methods may include (1) optical single-sideband generation using a nested Mach-Zehnder electro-optic modulator, (2) serrodyne shifting with an electro-optic modulator, (3) optical phase-lock loop with two separate lasers, (4) optical injection locking with two separate lasers, or (5) using acousto-optic modulators.

The circulator optics 406 may receive the TX optical waveform 405, which is input to the scanner 408 as a TX signal. The TX signal may be transmitted through the scanner 408 to illuminate an object 410 (or an area of interest). The scanner 408 may receive a return optical signal reflected by the object 410 as a receive (RX) optical signal. In some implementations, the optical mixer 414 may mix the RX optical signal with an optical LO signal 413 to produce an optical signal, which may be then detected by the detector 416 and further delivered to the DDC system 450 of the DSP system 418 as analog data input 449 (see FIG. 4B).

Referring to FIG. 4B, the digitizer 452 of the DDC system 450 may digitize the analog data input to output a digital signal of interest which includes strictly positive frequency content because the RX optical signal may have a frequency range that has been shifted by the frequency offset ($f_o$) from the LO frequency. The digital mixer 454 of the DDC system 450 may extract a full complex signal (e.g., I/Q components) from the digital signal by digitally mixing the digital signal to produce I data and Q data and recombine the I/Q data into a complex signal (not shown). In some implementations, if $s(t)$ and $s'(t)$ denote the original digital signal and the complex signal, respectively, and $I(t)$ and $Q(t)$ denote the I data and Q data, respectively, the DDC system 450 may perform the step of generating the complex signal $s'(t)$ according to Equation 4 to Equation 6. For example, the digital mixer 454 may digitally mix the digital signal $s(t)$ based on the frequency offset $f_o$ to generate I data and Q data according to Equation 4 and Equation 5. The low pass filter 456 may further process the I data and Q data to eliminate a high-frequency component. The down-sampler (or decimator) 458 may down-sample (or decimate) the output of the low pass filter 456 to reduce the sample rate of the I data and Q data. After performing LPF and/or down-sampling, The DDC system 450 may recombine the I/Q data into the complex signal $s'(t)$ and further deliver the $s'(t)$ signal to the another DSP system 460. The DSP system 460 may perform further processing (e.g., bandpass filtering and/or down-sampling) on the $s'(t)$ signal as dictated by signal processing needs.

Figure 4C:
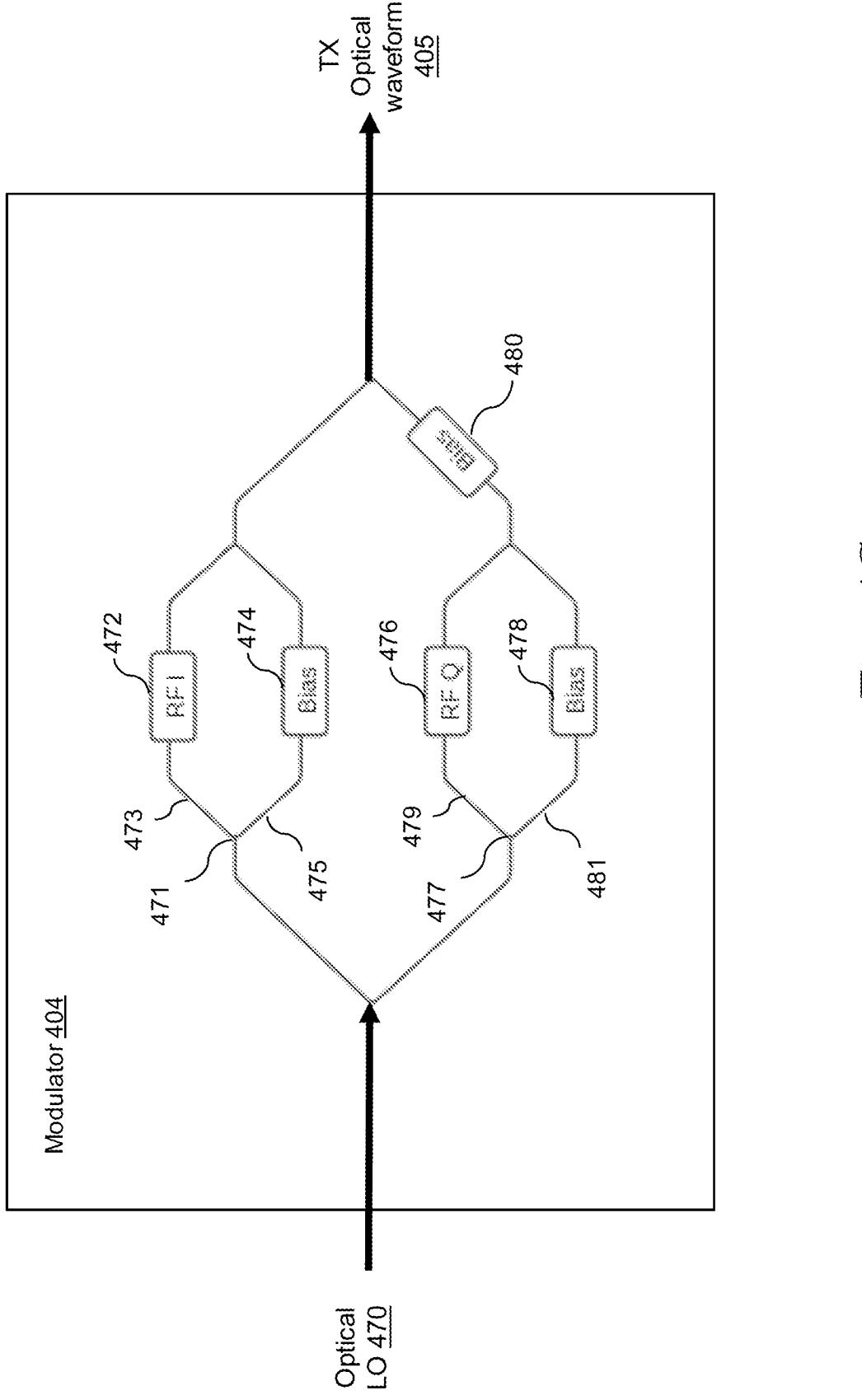
FIG. 4C is a block diagram illustrating an example of a modulator in a lidar sensor system, according to some implementations.

FIG. 4C is a block diagram illustrating an example of a frequency shifting modulator 404 in a lidar sensor system, according to some implementations. In some implementations, the modulator 404 (see FIG. 4A) may be a nested Mach-Zehnder electro-optic modulator (e.g., optical IQ modulator or QPSK modulator; hereinafter referred to as "nested MZ modulator"). In some implementations, a nested MZ modulator may provide a complete digital control and/or single step upshifting and waveform modulation to flexibly perform a single sideband generation of a $f_o$-shifted waveform.

Referring to FIG. 4C, the nested MZ modulator 404 may include a first MZ modulator and a second MZ modulator. In some implementations, the first MZ modulator may include an input waveguide 471 and two waveguide interferometer arms 473, 475 such that the input waveguide 471 is split up into the two arms 473, 475. Similarly, the second MZ modulator may include an input waveguide 477 and two waveguide interferometer arms 479, 481 such that the input waveguide 477 is split up into the two arms 479, 481.

Referring to FIG. 4A and FIG. 4C, the nested MZ modulator 404 may receive an input LO signal 470 from the local oscillator 412 which is splitted to two branches to the first MZ modulator and the second MZ modulator, modulate the input LO signal 470 based on I data 472 and Q data 476, and output the modulated TX optical waveform 405 with the frequency offset $f_0$. The nested MZ modulator 404 may apply the I data 472 and the Q data 476 onto the arm 473 of the first MZ modulator and the arm 479 of the second MZ modulator, respectively. In some implementations, two arms 475, 481 may be biased with bias voltages 474, 478, respectively, such that the bias voltages 474, 478 satisfy the single sideband modulation (SSB) conditions. In some implementations, a bias voltage 480 may be applied to an output terminal of the second MZ modulator to maintain a frequency offset (e.g., frequency offset $f_o$) between the optical LO signal 470 and the modulated TX optical waveform 405.

Figure 4D:
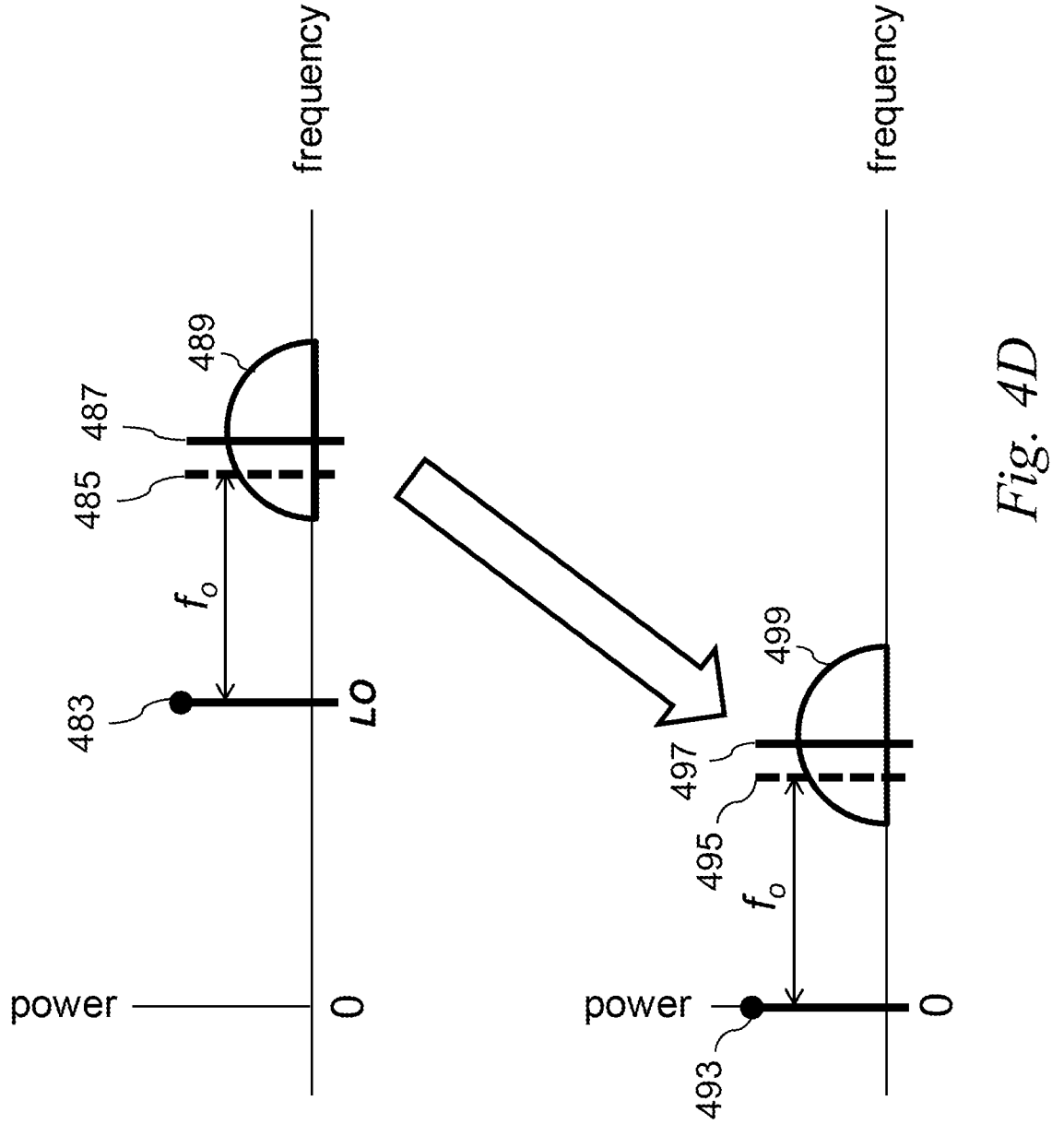
FIG. 4D is a block diagram illustrating an example of down converting a signal to a lower frequency signal with a frequency offset, according to some implementations.

FIG. 4D is a block diagram illustrating an example of down converting a signal to a lower frequency signal with a frequency offset, according to some implementations.

For example, a lidar sensor system (e.g., lidar sensor system 400) may perform IQ modulation of an LO signal having an LO frequency 483 based on an I/Q data stream to produce a modulated waveform with a frequency offset (e.g., frequency offset $f_o$), transmit the modulated waveform as a transmit (TX) signal (e.g., TX optical waveform 405), and receive a receive (RX) signal 489 reflected from an object (e.g., optical return signal reflected from object 410). The RX signal 489 may have a center frequency 487 and the frequency range of the RX signal 489 may include a frequency 485 which is away from the LO frequency 483 by the frequency offset $f_0$. A DSP system (e.g., DDC 450) of the lidar sensor system may down convert the RX signal 489 by the frequency offset $f_o$ towards a DC frequency 493 to output a down-converted signal 499 having a center frequency 497. The frequency range of the down-converted signal 499 may include a frequency 495 which is away from the DC frequency 493 by the frequency offset $f_0$.

As shown in FIG. 4D, unlike the RX signal 386 as shown in FIG. 3C, the frequency range of the RX signal 489 may not overlap with a region crossing through the LO frequency 483. Moreover, unlike the down-converted signal 396 as shown in FIG. 3C, the range of the down-converted signal

396 may not be around the DC frequency 493, including only positive frequencies. In other words, the RX signal 489 in the upper sideband may be down converted only to a positive frequency range which is away from the DC frequency 392 by approximately the frequency offset $f_0$. Therefore, as shown in FIG. 4D, digital down conversion according to some implementations (e.g., DDC by DDC system 450 in FIG. 4B) can make the information carried by the RX signal 489 more clear than the information carried by the RX signal 386 in FIG. 3C, thereby more accurately measuring or detecting the phase difference between the TX signal and the RX signal. Moreover, because the RX signal 489 lies only in the positive frequency range, e.g., away from the DC frequency 493 by approximately the frequency offset $f_o$, the detectors (e.g., detectors 416) may not suffer from an artifact at the zero (DC) frequency due to electronic 1/f noise and a flat frequency response of the detectors.

FIG. 5 is a block diagram illustrating another example of a lidar sensor system 500, according to some implementations.

The lidar sensor system 500 may include a laser source 502, a local oscillator 504, circulator optics 506, a scanner 508, an optical IQ modulator 512, an optical mixer (or beam combiner) 522, a pair of detectors 524, an ADC 526, a digital down conversion (DDC) system 550, and a DSP system 570. The DDC system 550 may include a digital oscillator (e.g. direct digital synthesizer (DDS)) 556, digital multipliers (or digital mixers) 552, 554, filters (e.g., low pass filters) 558, 560, and a digital adder (or digital combiner) 562. The DSP system 570 may include a bandpass filter 572 and a down-sampler (or decimator) 574.

Referring to FIG. 5, the laser 502 may generate a beam which is oscillated by the local oscillator 504 to output an optical LO signal 511 having an LO frequency. In some implementations, the optical IQ modulator 512 may receive the optical LO signal 511, an input I data stream 513 and an input Q data stream 515. The optical IQ modulator 512 may determine a frequency offset ($f_o$) between a transmit (TX) optical signal and the optical LO signal 511, and generate a frequency-shifted optical signal with its frequency shifted from the LO frequency by the frequency offset ($f_o$) by performing a bias control 517. In some implementations, the optical IQ modulator 512 may be an nested MZ modulator (e.g., nested MZ modulator 404 shown in FIGS. 4A and 4C), and the bias control 517 may be applying bias voltages (e.g., bias voltages 474, 478, 480 shown in FIG. 4C) to the nest MZ modulator. In some implementations, the optical IQ modulator 512 may generate the frequency-shifted optical signal using one of (1) optical single-sideband generation using a nested Mach-Zehnder electro-optic modulator, (2) serrodyne shifting with an electro-optic modulator, (3) optical phase-lock loop with two separate lasers, (4) optical injection locking with two separate lasers, or (5) using acousto-optic modulators.

The optical IQ modulator 512 may receive the frequency-shifted optical signal as an I carrier, and apply a 90° phase shift to the I carrier to generate a Q carrier. The optical IQ modulator 512 may multiply the I and Q carriers by the I and Q data streams, respectively, and sum two signals resulting from these multiplications to produce a modulated frequency-shifted waveform 519 (hereinafter "modulated $f_o$-shifted waveform"). The circulator optics 506 may receive the modulated $f_o$-shifted waveform 519, which is input to the scanner 508 as a TX signal. The TX signal may be transmitted through the scanner 508 to illuminate an object 510 (or an area of interest). The scanner 508 may receive a return optical signal reflected by the object 510 as a receive (RX)

optical signal 521. In some implementations, the optical mixer 522 may mix the RX optical signal 521 with an optical LO signal 523 to produce an optical signal, which may be then detected by the pair of detector 524 and digitized by the ADC 526 to produce a digital signal s(t). The digital signal s(t) may include strictly positive frequency content because the RX optical signal 521 may have a frequency range that has been shifted by the frequency offset ($f_o$) from the LO frequency.

Referring to FIG. 5, the digital oscillator or DDS 556 of the DDC system 550 may receive the frequency offset 555 ($f_o$) and generate a sine waveform and an inverse cosine waveform respectively having a frequency corresponding to the frequency offset ($f_o$). The digital multiplier 552 may multiply the sign waveform with the digital signal s(t) according to Equation 4 to generate down converted I data, which may be input to the filter 558 to produce I data I(t) 559. Similarly, the digital multiplier 554 may multiply the inverted cosine waveform with the digital signal s(t) according to Equation 5 to generate down converted Q data, which may be input to the filter 550 to produce Q data Q (t) 561. The digital adder 562 may combine the I data I(t) 559 and the Q data Q (t) 561 to produce a complex signal s'(t), which may be provided to the DSP system 570. The DSP system 570 may perform further processing (e.g., bandpass filtering by the bandpass filter 572 and/or down-sampling by the down-sampler 574) on the s'(t) signal as dictated by signal processing needs.

Unlike the lidar sensor system 340 in FIG. 3B which uses two ADC channels and an optical hybrid, the lidar sensor system 500 may include only a single ADC channel (for detection and digitization) to retrieve full phase/amplitude information of the RX optical signal, without using optical hybrids.

FIG. 6 is a flowchart illustrating an example methodology for a lidar sensor system using a digital down conversion according to some implementations. In this example methodology, a process 600 begins at step 610 by generating, by an electronic module of a lidar sensor system (e.g., lidar sensor system 400 or 500) based on a beam generated by a laser source (e.g., laser 402 or 502), an optical signal (e.g., TX optical waveform 405 or modulated fo-shifted waveform 519) that is frequency-shifted by a frequency offset (e.g., frequency offset $f_o$) relative to a local oscillator (LO) signal (e.g., optical LO signal 511). The electronic module may include one or more circuits or one or more processors (e.g., processor 710). These circuits may generally include one or more chips (e.g., analog integrated circuits (IC) chip), one or more application-specific ICs (ASICs), one or more field-programmable gate arrays (FPGAs) or one or more programmable DSP devices.

In some embodiments, the electronic module may generate the optical signal by performing an optical single-sideband modulation of the beam using a nested Mach-Zehnder electro-optic modulator (e.g., frequency shifting modulator or nested MZ modulator 404, optical IQ modulator 512).

In some embodiments, the laser source may include two lasers configured in an optical phase-lock loop. The electronic module may generate the optical signal by stabilizing the two lasers with the frequency offset using the optical phase-lock loop. In some embodiments, the lidar sensor system may include an electro-optic modulator. The electronic module may be configured to generate the optical signal by performing a serrodyne frequency shifting on the beam using the electro-optic modulator. In some embodiments, the laser source may include two lasers configured in an optical injection locking. The electronic module may generate the optical signal by performing a sideband modulation of the beam using the optical injection locking.

At step 620, in some implementations, the electronic module may control a transmitter (e.g., scanner 408, 508) to transmit the optical signal (e.g., TX optical waveform 405 or modulated fo-shifted waveform 519) to an environment. For example, the electronic module may transmit the optical signal using circulator optics (e.g., circulator optics 406, 506) and/or a scanner (e.g., scanner 408, 508). At step 630, in some implementations, in response to transmitting the optical signal, the electronic module may receive a returned optical signal (e.g., RX optical signal 521) that is reflected from an object (e.g., object 410, 510) in the environment. For example, the electronic module may receive the returned optical signal using a scanner (e.g., scanner 408, 508) and/or circulator optics (e.g., circulator optics 406, 506).

At step 640, in some implementations, the electronic module may generate a digital signal based on the received signal. In some embodiments, the electronic module may generate the digital signal by (1) optically mixing the RX optical signal with the LO signal, (2) detecting the optically mixed signal, and (3) digitizing the detected signal. For example, the electronic module may generate a digital signal by mixing the RX optical signal with an optical LO signal using an optical mixer (e.g., optical mixer 414, 522) to produce an optical signal, which may be then detected by a detector (e.g., detector 416, a pair of detectors 524) and further digitized by an ADC (e.g., ADC 452, 526). In some embodiments, the electronic module may generate the digital signal based on the received signal through a single channel of detection and digitization (e.g., single ADC channel in FIG. 4A and FIG. 5).

At step 650, in some implementations, the electronic module may digitally mix the digital signal (e.g., using digital mixer 454, DDS 556, digital multipliers 552) based on the frequency offset (e.g., frequency offset $f_o$) to generate a sample signal (e.g., complex data output 459). In some embodiments, the electronic module may digitally mix the digital signal by (1) multiplying a first waveform (e.g., sine waveform having a frequency corresponding to the frequency offset) with the digital signal to generate a first mixed signal (e.g., down-converted I data) and (2) multiplying a second waveform with the digital signal to generate a second mixed signal (e.g., down-converted Q data). Each of the first and second waveforms may have a frequency corresponding to the frequency offset. The electronic module may be configured to generate the sample signal by (1) performing a low pass filtering on the first mixed signal (e.g., using LPF 456, filter 558) and (2) performing a low pass filtering on the second mixed signal (e.g., using LPF 456, filter 560). The electronic module may be configured to generate the sample signal by (1) down-sampling the first mixed signal (using down-sampler 458) and (2) down-sampling the second mixed signal (using down-sampler 458).

At step 660, in some implementations, one or more processors (e.g., processor 710) may determine, based on the sample signal, a range to the object (e.g., calculating range R to the object using Equation 3).

Figure 7:
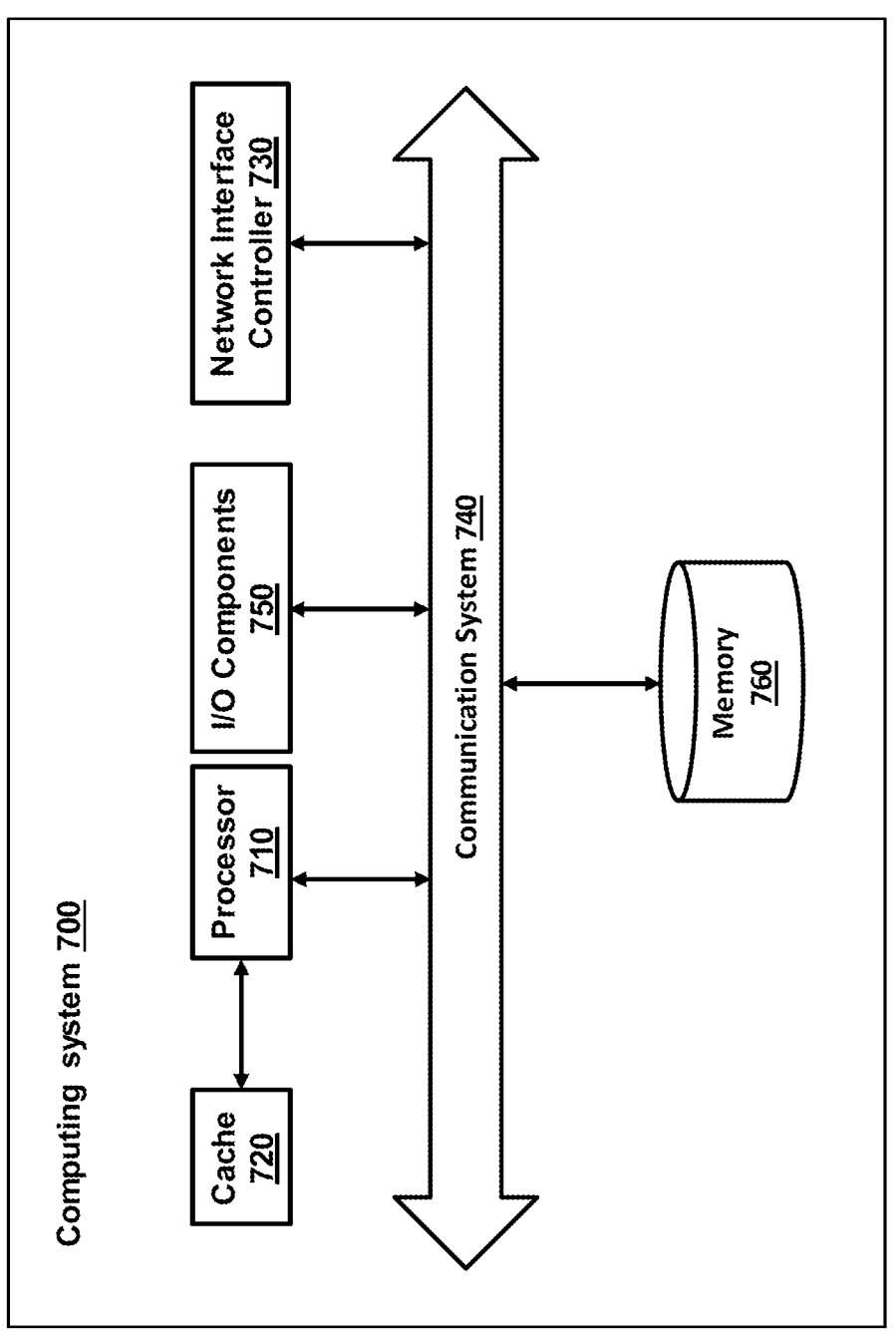
FIG. 7 is a block diagram illustrating an example of a computing system according to some implementations.

FIG. 7 is a block diagram illustrating an example of a computing system according to some implementations.

Referring to FIG. 7, the illustrated example computing system 700 includes one or more processors 710 in communication, via a communication system 740 (e.g., bus), with memory 760, at least one network interface controller 730 with network interface port for connection to a network (not shown), and other components, e.g., an input/output ("I/O") components interface 750 connecting to a display (not illustrated) and an input device (not illustrated). Generally, the processor(s) 710 will execute instructions (or computer programs) received from memory. The processor(s) 710 illustrated incorporate, or are directly connected to, cache memory 720. In some instances, instructions are read from memory 760 into the cache memory 720 and executed by the processor(s) 710 from the cache memory 720.

In more detail, the processor(s) 710 may be any logic circuitry that processes instructions, e.g., instructions fetched from the memory 760 or cache 720. In some implementations, the processor(s) 710 are microprocessor units or special purpose processors. The computing device 700 may be based on any processor, or set of processors, capable of operating as described herein. The processor(s) 710 may be single core or multi-core processor(s). The processor(s) 710 may be multiple distinct processors.

The memory 760 may be any device suitable for storing computer readable data. The memory 760 may be a device with fixed storage or a device for reading removable storage media. Examples include all forms of non-volatile memory, media and memory devices, semiconductor memory devices (e.g., EPROM, EEPROM, SDRAM, and flash memory devices), magnetic disks, magneto optical disks, and optical discs (e.g., CD ROM, DVD-ROM, or Blu-Ray® discs). A computing system 700 may have any number of memory devices as the memory 760.

The cache memory 720 is generally a form of computer memory placed in close proximity to the processor(s) 710 for fast read times. In some implementations, the cache memory 720 is part of, or on the same chip as, theqj processor(s) 710. In some implementations, there are multiple levels of cache 720, e.g., L2 and L3 cache layers.

The network interface controller 730 manages data exchanges via the network interface (sometimes referred to as network interface ports). The network interface controller 730 handles the physical and data link layers of the OSI model for network communication. In some implementations, some of the network interface controller's tasks are handled by one or more of the processor(s) 710. In some implementations, the network interface controller 730 is part of a processor 710. In some implementations, a computing system 700 has multiple network interfaces controlled by a single controller 730. In some implementations, a computing system 700 has multiple network interface controllers 730. In some implementations, each network interface is a connection point for a physical network link (e.g., a cat-5 Ethernet link). In some implementations, the network interface controller 730 supports wireless network connections and an interface port is a wireless (e.g., radio) receiver/transmitter (e.g., for any of the IEEE 802.11 protocols, near field communication "NFC", Bluetooth, ANT, or any other wireless protocol). In some implementations, the network interface controller 730 implements one or more network protocols such as Ethernet. Generally, a computing device 700 exchanges data with other computing devices via physical or wireless links through a network interface. The network interface may link directly to another device or to another device via an intermediary device, e.g., a network device such as a hub, a bridge, a switch, or a router, connecting the computing device 700 to a data network such as the Internet.

The computing system 700 may include, or provide interfaces for, one or more input or output ("I/O") devices. Input devices include, without limitation, keyboards, microphones, touch screens, foot pedals, sensors, MIDI devices, and pointing devices such as a mouse or trackball. Output devices include, without limitation, video displays, speakers, refreshable Braille terminal, lights, MIDI devices, and 2-D or 3-D printers.

Other components may include an I/O interface, external serial device ports, and any additional co-processors. For example, a computing system 700 may include an interface (e.g., a universal serial bus (USB) interface) for connecting input devices, output devices, or additional memory devices (e.g., portable flash drive or external media drive). In some implementations, a computing device 700 includes an additional device such as a co-processor, e.g., a math co-processor can assist the processor 710 with high precision or complex calculations.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of blocks in the processes disclosed is an example of illustrative approaches. Based upon design preferences, it is understood that the specific order or hierarchy of blocks in the processes may be rearranged while remaining within the scope of the previous description. The accompanying method claims present elements of the various blocks in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the blocks of various examples must be performed in the order presented.

As will be appreciated by one of skill in the art the order of blocks in the foregoing examples may be performed in any order. Words such as "thereafter," "then," "next," etc. are not intended to limit the order of the blocks; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm blocks described in connection with the examples disclosed herein may be implemented as electronic hardware, computer software, or combinations of both. To clearly illustrate this interchangeability of hardware and software, various illustrative components, blocks, modules, circuits, and blocks have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The blocks of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A light detection and ranging (lidar) sensor system, the lidar sensor system comprising:

a laser source configured to generate a beam; and electronic module configured to:

generate, based on the beam, an optical signal that is frequency-shifted by a frequency offset relative to a local oscillator (LO) signal and that is modulated by an IQ modulation;

control a transmitter to transmit the optical signal to an environment;

in response to transmitting the optical signal, receive a returned optical signal that is reflected from an object in the environment;

generate a digital signal based on the returned optical signal;

digitally mix the digital signal based on the frequency offset to generate a sample signal, wherein the sample signal includes I data and Q data associated with the IQ modulation of the optical signal; and one or more processors configured to:

determine, based on the sample signal, a range to the object.

2. The lidar sensor system as recited in claim 1, further comprising:

a nested Mach-Zehnder electro-optic modulator, wherein the electronic module is configured to generate the optical signal by performing an optical single-sideband modulation of the beam using the nested Mach-Zehnder electro-optic modulator.

3. The lidar sensor system as recited in claim 1, further comprising:

an electro-optic modulator, wherein the electronic module is configured to generate the optical signal by performing a serrodyne frequency shifting on the beam using the electro-optic modulator.

4. The lidar sensor system as recited in claim 1, wherein the laser source comprises two lasers configured in an optical phase-lock loop, wherein the electronic module is configured to generate the optical signal by stabilizing the two lasers with the frequency offset using the optical phase-lock loop.

5. The lidar sensor system as recited in claim 1, wherein the laser source comprises two lasers configured in an optical injection locking, wherein the electronic module is configured to generate the optical signal by performing a sideband modulation of the beam using the optical injection locking.

6. The lidar sensor system as recited in claim 1, wherein the electronic module is configured to generate the digital signal by (1) optically mixing the returned optical signal with the LO signal, (2) detecting the optically mixed signal, and (3) digitizing the detected signal.

7. The lidar sensor system as recited in claim 1, wherein the electronic module is configured to generate the digital signal based on the returned optical signal through a single channel of detection and digitization.

8. The lidar sensor system as recited in claim 1, wherein the electronic module is configured to digitally mix the digital signal by (1) multiplying a first waveform with the digital signal to generate a first mixed signal and (2) multiplying a second waveform with the digital signal to generate a second mixed signal, and each of the first and second waveforms has a frequency corresponding to the frequency offset.

9. The lidar sensor system as recited in claim 8, wherein the electronic module is configured to generate the sample signal by (1) performing a low pass filtering on the first mixed signal and (2) performing a low pass filtering on the second mixed signal.

10. The lidar sensor system as recited in claim 8, wherein the electronic module is configured to generate the sample signal by (1) down-sampling the first mixed signal and (2) down-sampling the second mixed signal.

11. An autonomous vehicle control system comprising:

one or more processors; and one or more computer-readable storage mediums storing instructions that are executable by the one or more processors to cause the one or more processors to:

generate, based on a beam generated from a laser source, an optical signal that is frequency-shifted by a frequency offset relative to a local oscillator (LO) signal and that is modulated by an IQ modulation;

control a transmitter to transmit the optical signal to an environment;

in response to transmitting the optical signal, receive a returned optical signal that is reflected from an object in the environment;

generate a digital signal based on the returned optical signal;

digitally mix the digital signal based on the frequency offset to generate a sample signal, wherein the sample signal includes I data and Q data associated with the IQ modulation of the optical signal;

determine, based on the sample signal, a range to the object; and control operation of a vehicle using the range to the object.

12. The autonomous vehicle control system as recited in claim 11, wherein the one or more processors are configured to generate the digital signal by (1) optically mixing the returned optical signal with the LO signal, (2) detecting the optically mixed signal, and (3) digitizing the detected signal.

13. The autonomous vehicle control system as recited in claim 11, wherein the one or more processors are configured to generate the digital signal based on the returned optical signal through a single channel of detection and digitization.

14. The autonomous vehicle control system as recited in claim 11, wherein the one or more processors are configured to digitally mix the digital signal by (1) multiplying a first waveform with the digital signal to generate a first mixed signal and (2) multiplying a second waveform with the digital signal to generate a second mixed signal, and each of the first and second waveforms has a frequency corresponding to the frequency offset.

15. The autonomous vehicle control system as recited in claim 14, wherein the one or more processors are configured to generate the sample signal by (1) performing a low pass filtering on the first mixed signal and (2) performing a low pass filtering on the second mixed signal.

16. The autonomous vehicle control system as recited in claim 14, wherein the one or more processors are configured to generate the sample signal by (1) down-sampling the first mixed signal and (2) down-sampling the second mixed signal.

17. An autonomous vehicle comprising:

at least one of a steering system or a braking system; and a vehicle controller comprising one or more processors configured to:

generate, based on a beam generated from a laser source, an optical signal that is frequency-shifted by a frequency offset relative to a local oscillator (LO) signal and that is modulated by an IQ modulation;

control a transmitter to transmit the optical signal to an environment;

in response to transmitting the optical signal, receive a returned optical signal that is reflected from an object in the environment;

generate a digital signal based on the returned optical signal;

digitally mix the digital signal based on the frequency offset to generate a sample signal, wherein the sample signal includes I data and Q data associated with the IQ modulation of the optical signal;

determine, based on the sample signal, a range to the object; and control the at least one of the steering system or the braking system using the range to the object.

18. The autonomous vehicle as recited in claim 17, wherein the one or more processors are configured to digitally mix the digital signal by (1) multiplying a first waveform with the digital signal to generate a first mixed signal and (2) multiplying a second waveform with the digital signal to generate a second mixed signal, and each of the first and second waveforms has a frequency corresponding to the frequency offset.

19. The autonomous vehicle as recited in claim 18, wherein the one or more processors are configured to generate the sample signal by (1) performing a low pass filtering on the first mixed signal and (2) performing a low pass filtering on the second mixed signal.

20. The autonomous vehicle as recited in claim 18, wherein the one or more processors are configured to generate the sample signal by (1) down-sampling the first mixed signal and (2) down-sampling the second mixed signal.

* * * * *